(12) United States Patent
Kanazawa et al.

(10) Patent No.: US 6,251,721 B1
(45) Date of Patent: Jun. 26, 2001

(54) SEMICONDUCTOR DEVICE AND METHOD OF MANUFACTURING THE SAME

(75) Inventors: Kenichi Kanazawa; Koichi Hashimoto; Yoshihiro Takao; Masaki Katsube, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/545,598

(22) Filed: Apr. 7, 2000

(30) Foreign Application Priority Data

Jul. 12, 1999 (JP) .................................................. 11-198058
Feb. 25, 2000 (JP) ............................................. 2000-049869

(51) Int. Cl.$^7$ ...................... H01L 21/8242; H01L 21/20; H01L 21/4763
(52) U.S. Cl. .......................... 438/240; 438/241; 438/253; 438/396; 438/618
(58) Field of Search .................................... 438/210, 240, 438/241, 253, 396, 597, 618, 622, 970; 257/763, 751, 753

(56) References Cited

U.S. PATENT DOCUMENTS

| 5,930,618 | * | 7/1999 | Sun et al. | 438/240 |
| 5,966,600 | * | 10/1999 | Hong | 438/253 |
| 6,117,723 | * | 9/2000 | Huang | 438/238 |
| 6,159,839 | * | 12/2000 | Jeng et al. | 438/618 |
| B1 6,177,306 | * | 1/2001 | Wu | 438/241 |

OTHER PUBLICATIONS

Wolf, Stanley Silicon Processing For The VLSI Era vol. 3: The Submicron MOSFET:, Lattice Press, 1995, pp. 623–642.*

* cited by examiner

Primary Examiner—Michael Lebentritt
(74) Attorney, Agent, or Firm—Armstrong, Westerman, Hattori, McLeland & Naughton, LLP

(57) ABSTRACT

After an SAC film is formed to a thickness not to fill the spaces between gate electrodes in a memory cell region, a silicon oxide film is formed to a thickness to fill the spaces. A side wall made of a silicon oxide film is formed on the side surface of only a gate electrode in a peripheral circuit region, and a metal silicide is formed on the exposed substrate surface. A BLC film is formed on the entire surface. A contact hole is formed in self alignment using the SAC film and the BLC film. In this method, silicidation of the source/drain of a transistor in the peripheral circuit region and the self-alignment technique such as BLC or SAC can be simultaneously used to enable an increase in the degree of integration and improvement of performance of a semiconductor device having a metal silicide on the transistor in the logic circuit.

11 Claims, 31 Drawing Sheets

PRIOR ART FIG. 31A
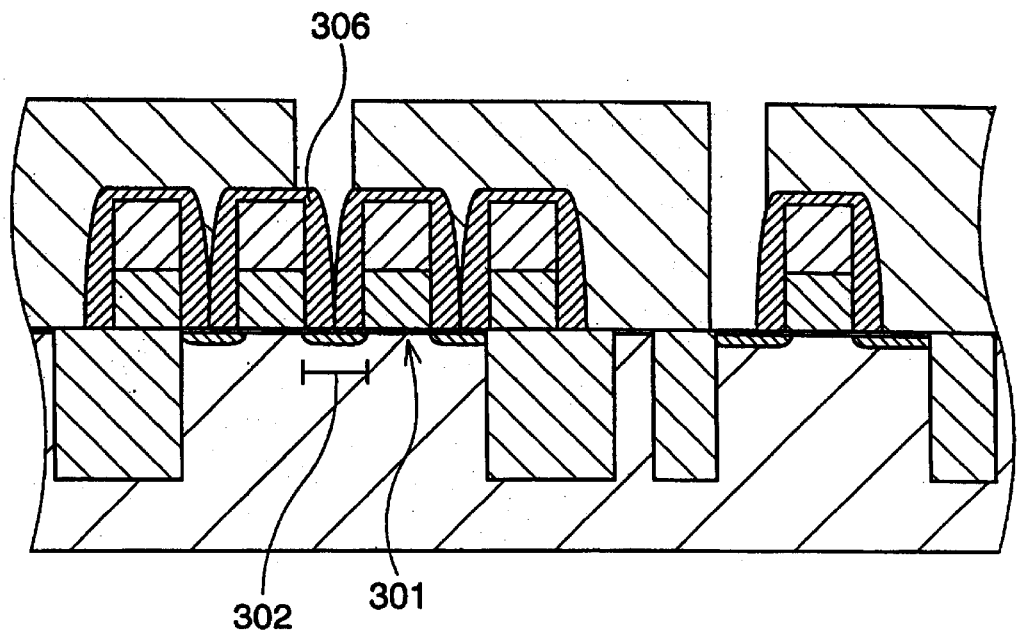
PRIOR ART FIG. 31B
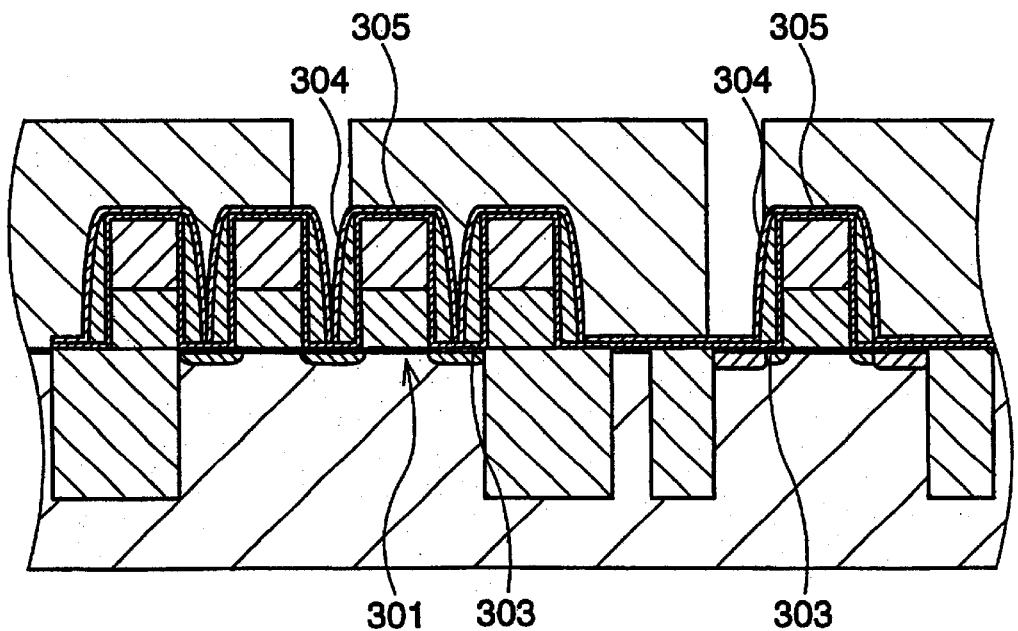

SEMICONDUCTOR DEVICE AND METHOD OF MANUFACTURING THE SAME

BACKGROUND OF THE INVENTION

1. Field of the Invention

The present invention relates to a semiconductor device suitable for high integration and a method of manufacturing the same, particularly to a semiconductor device suitably applicable to a semiconductor memory, such as a DRAM or a flash memory, having an element region and a peripheral circuit region.

2. Description of the Related Art

In recent years, there is a strong tendency to demand not only high integration but also a higher added value of a semiconductor device. For example, for a DRAM hybrid chip having a memory cell and a logic circuit (a peripheral circuit of the memory cell), which has received a great deal of attention as a semiconductor memory in a new field, a technique of forming a metal silicide that reduces the resistance value in the source and the drain of a transistor constructing the logic circuit is indispensable. In application of this technique, however, a fundamental problem is posed in which no metal silicide can be used for the source and the drain of the transistor constructing the memory cell of a DRAM from the viewpoint of refresh characteristics. Hence, for the source and the drain of the transistor, the memory cell side and the logic circuit side must be independently formed.

However, the above-described technique has an aspect inconsistent with the requirement of a highly integrated memory cell. More specifically, as the degree of integration rises, the alignment margin of contact holes becomes strict. To relax it, a nitride film with an etching rate lower than that of an oxide film is formed as a passivation film covering the transistor, and a borderless contact technique (BLC) or a self-alignment contact technique (SAC) of forming a contact hole in self-alignment is used. In this example, use of the self-aligning technique described above poses a problem to be described below in detail.

When the memory cell size is reduced by high integration, the distance between adjacent gate electrodes of the memory cell also shortens. In this case, as shown in FIG. 31A, when the distance between gate electrodes 301 shortens, an element interval 302 between the gate electrodes 301 becomes zero due to a BLC or SAC nitride film 306. This disables BLC or SAC as a preprocess for formation of a metal silicide, nothing to say of metal silicide formation.

As a countermeasure against this problem, a technique has been proposed in which after formation of the gate electrodes 301, a thin nitride film 303 for SAC, which has a thickness of about 30 nm, and an oxide film having a predetermined thickness are sequentially formed, and then a side wall 304 is formed on the entire surface of the structure by anisotropic etching, as shown in FIG. 31B. In this case, however, since a metal silicide need be formed on only the transistor on the logic circuit side, the source/drain surface of the transistor on the logic circuit side must be exposed by etching while masking the structure on the memory cell side. After formation of a metal silicide, a BLC nitride film 305 is formed. At this time, since the interval between the gate electrodes 301 is small, the gap between the side walls 304 is filled with the nitride film 305, as shown in FIG. 31B, so the nitride film 305 is substantially very thick when viewed from the upper side in forming a contact hole. This disables SAC on the memory cell side.

As described above, the requirement for reduction of resistance in the transistor of the logic circuit and that for an increase in the degree of integration of the entire memory cell portion and the logic circuit portion have tradeoff relationships. It is very difficult to meet these requirements simultaneously.

SUMMARY OF THE INVENTION

It is an object of the present invention to provide a semiconductor device in which, when the first region is a memory cell region, and the second region is a peripheral circuit region, silicidation of the source and the drain of a transistor in the peripheral circuit region and the self-alignment technique such as BLC or SAC are simultaneously used to enable an increase in the degree of integration and improvement of performance (improvement of operation speed) of a semiconductor memory having a metal silicide on the transistor of the logic circuit, and a method of manufacturing the semiconductor device.

In order to achieve the above object, the present invention has the following aspects.

According to the first aspect, a method of manufacturing a semiconductor device, comprises the steps of forming gate electrodes in a first region over a semiconductor substrate and one gate electrode in a second region over said semiconductor substrate, and then forming first impurity diffusion layers on both sides of said gate electrodes in said first and second regions; forming a first passivation film in said first and second regions; forming an insulating film in said first and second regions, processing said insulating film in said second region to form a side wall on both sides of the gate electrode in said second region to expose a surface of said semiconductor substrate on both sides of said side wall; forming, in said semiconductor substrate exposed on both sides of said side wall, a second impurity diffusion layer partially to overlap said first impurity diffusion layer; forming a second passivation film in said first and second regions; and forming a first connection hole for exposing said first impurity diffusion layer in said first region, and a second connection hole for exposing said second impurity diffusion layer in said second region, by using said first and second passivation films.

According to the second aspect, a method of manufacturing a semiconductor device, comprises the steps of forming gate electrodes in a first region over a semiconductor substrate and one gate electrode in a second region over said semiconductor substrate, and then forming first impurity diffusion layers on both sides of said gate electrodes in said first and second regions; forming a first passivation film in said first and second regions; forming an insulating film in said first and second regions, processing said insulating film in said second region to form a side wall on both sides of the gate electrode in said second region to expose a surface of said semiconductor substrate on both sides of said side wall; forming, in said semiconductor substrate exposed on both sides of said side wall, a second impurity diffusion layer partially to overlap said first impurity diffusion layer, and then removing said insulating film in said first region and said side wall in said second region; forming a second passivation film in said first and second regions; and forming a first connection hole for exposing said first impurity diffusion layer in said first region, and a second connection hole for exposing said second impurity diffusion layer in said second region, by using said first and second passivation films.

According to the third aspect, in a semiconductor device having first and second regions in which elements having gate electrodes with sources/drains are formed, a first passivation film is formed to a thickness not to fill spaces between said gate electrodes in said first region, and an insulating film is formed on said first passivation film to fill said spaces between said gate electrodes in said first region, a side wall is formed on only the gate electrode in said second region, a metal silicide film is formed on the source/drain in said second region, and a second passivation film is formed to cover said gate electrode in said second region including said side wall, and first and second connection holes are formed to expose parts of said first and second passivation films from side surfaces, and an interconnection is formed to connect electrically the source/drain in said first region and said metal silicide film through said first and second connection holes.

According to the fourth aspect, in a semiconductor device having first and second regions in which elements having gate electrodes with sources/drains are formed, first and second passivation films are formed in said first and second regions to a total thickness not to fill spaces between said gate electrodes in said first region, said first and second passivation films are formed to cover the entire surface in said first region, said first passivation film is formed only on and near a side surface of the gate electrode in said second region, a metal silicide film is formed on the source/drain in said second region, and said second passivation film is formed to cover the entire surface, and first and second connection holes are formed to expose parts of said first and second passivation films from side surfaces, and an interconnection is formed to connect electrically the source/drain in said first region and said metal silicide film through said first and second connection holes.

According to the fifth aspect, a method of manufacturing a semiconductor device, comprises the steps of forming gate electrodes in a first region over a semiconductor substrate and one gate electrode in a second region over said semiconductor substrate, and then forming first impurity diffusion layers on both sides of said gate electrodes in said first and second regions; forming a first passivation film in said first and second regions; forming an insulating film in said first and second regions, processing said insulating film in said second region to form a side wall on both sides of the gate electrode in said second region to expose a surface of said semiconductor substrate on both sides of said side wall; forming, in said semiconductor substrate exposed on both sides of said side wall, a second impurity diffusion layer partially to overlap said first impurity diffusion layer; forming a second passivation film in said first and second regions; and forming a first connection hole for exposing said first impurity diffusion layer in said first region, and a second connection hole for exposing said second impurity diffusion layer in said second region, by using said first and second passivation films.

In the semiconductor device manufacturing method of the present invention (the above first aspect), the first passivation film for SAC is formed on the entire surface. The side wall is formed on only the gate electrode in the second region (e.g., peripheral circuit region). After the metal silicide is formed on the second impurity diffusion layer, the second passivation film for BLC is formed. Even when the element interval between the gate electrodes in the first region (e.g., memory cell region) is very small, the space corresponding to the element interval is filled with the insulating film via the thin first passivation film. More specifically, the first passivation film for SAC is effectively formed on the gate electrode in the first region, and the second passivation film for BLC is effectively formed on the gate electrode (and side wall) in the second region. Hence, desired first and second connection holes can be formed using these passivation films such that the first impurity diffusion layer is partially exposed between the gate electrodes in the first region, and the metal silicide is partially exposed in the second region.

In the semiconductor device manufacturing method of the present invention (the above second aspect), since a side wall having a sufficient thickness can be formed for the transistor in the second region (e.g., peripheral circuit region), a transistor with stable characteristics can be constructed. In addition, when the insulting film in the first region and the side wall in the second region are removed before the second passivation film is formed, the first and second passivation films are formed on the side surfaces of the gate electrodes in the first and second regions. For this reason, not only the first passivation film for SAC but also the second passivation film for BLC can be used as a passivation film for SAC. Hence, the breakdown voltage of the connection holes formed in the first and second regions can be further improved.

According to the present invention, for example, as for the relationship between the first and second regions, when the first region is a memory cell region, and the second region is a peripheral circuit region, silicidation of the source/drain of a transistor in the peripheral circuit region and the self-alignment technique such as BLC or SAC can be simultaneously applied to enable an increase in the degree of integration and improvement of performance (improvement of operation speed) of a semiconductor device having a metal silicide on the transistor in the logic circuit.

BRIEF DESCRIPTION OF THE DRAWINGS

FIGS. 11A and 10B are schematic sectional views showing steps in manufacturing the DRAM according to the second embodiment;

FIGS. 31A and 31B are schematic sectional views showing steps in conventional DRAM manufacturing methods for explaining problems.

DETAILED DESCRIPTION OF THE PREFERRED EMBODIMENTS

Embodiments to which the present invention is applied will be described below in detail with reference to drawings.

(First Embodiment)

As an explanation of the principle of the present invention, a method of manufacturing a semiconductor device having first and second regions, and semiconductor elements of different types in these regions will be described. For the descriptive convenience, the structure of the semiconductor device and the manufacturing method thereof will be described together.

FIGS. 1A to 2B are schematic sectional views showing a method of manufacturing a semiconductor device according to this first embodiment.

Figure 1A:
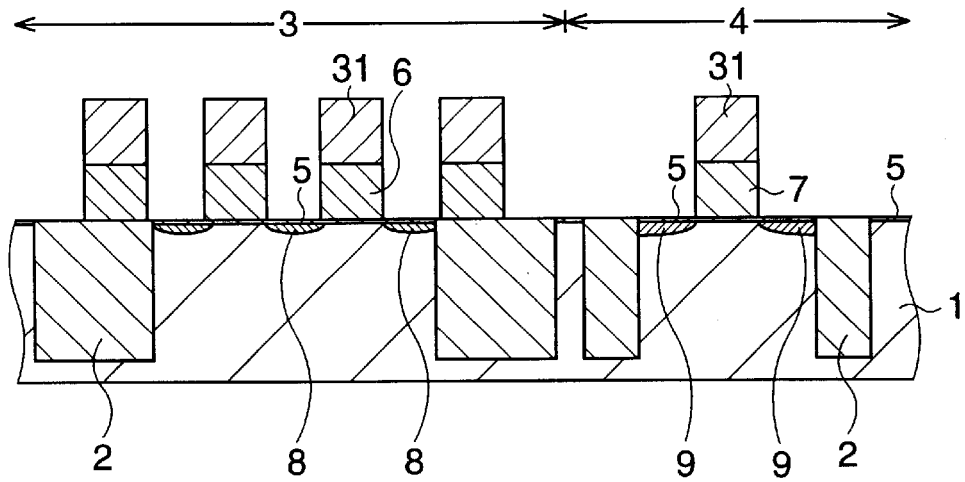
FIGS. 1A to 1C are schematic sectional views showing a method of manufacturing a semiconductor device according to the first embodiment of the present invention.

First, as shown in FIG. 1A, the element isolation region of, e.g., a p-type semiconductor substrate 1 is anisotropically etched to form a trench. The trench is filled with a silicon oxide film to form an element isolation structure 2. After a gate insulating film 5 is formed in first regions 3 and 4 defined by the element isolation structure 2, gate electrodes 6 and 7 on the gate insulating film 5 and an SAC thick silicon nitride film 31 on the gate electrodes are formed by patterning.

Ions are implanted into the semiconductor substrate 1 using the gate electrodes 6 and 7 as a mask to form LDD diffusion layers 8 and 9 (first impurity diffusion layers). In the first region 3, a transistor having the gate electrode 6 and the LDD diffusion layers 8 functioning as a source and a drain is formed.

Figure 1B:
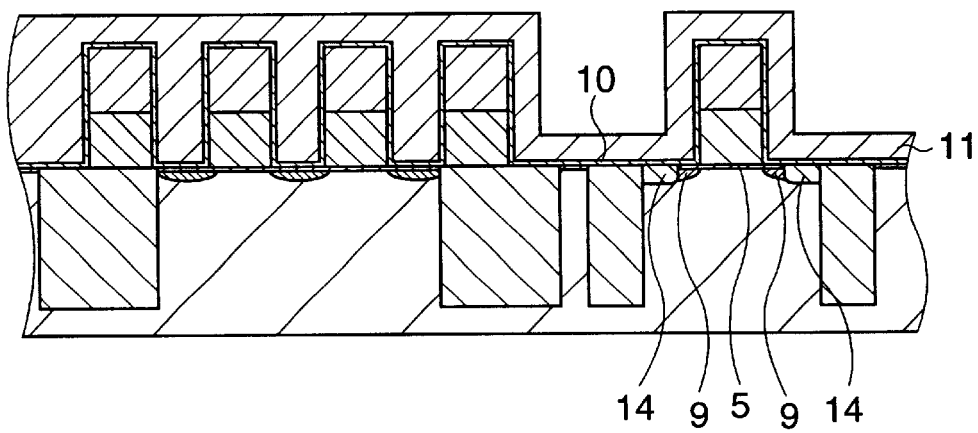

As shown in FIG. 1B, a silicon nitride film 10 having a thickness of about 30 nm is deposited on the entire surface as an SAC passivation film (first passivation film) not to fill the space between the gate electrodes 6 in the first region 3.

Next, a silicon oxide film 11 having a thickness of about 50 nm is deposited as a prospective side wall to fill the space between the gate electrodes 6. With this film thickness, the space between the adjacent gate electrodes 6 in the first region 3 is filled with the silicon oxide film 11, as shown in FIG. 1B, when the distance between the gate electrodes 6 is 150 nm or less.

Figure 1C:
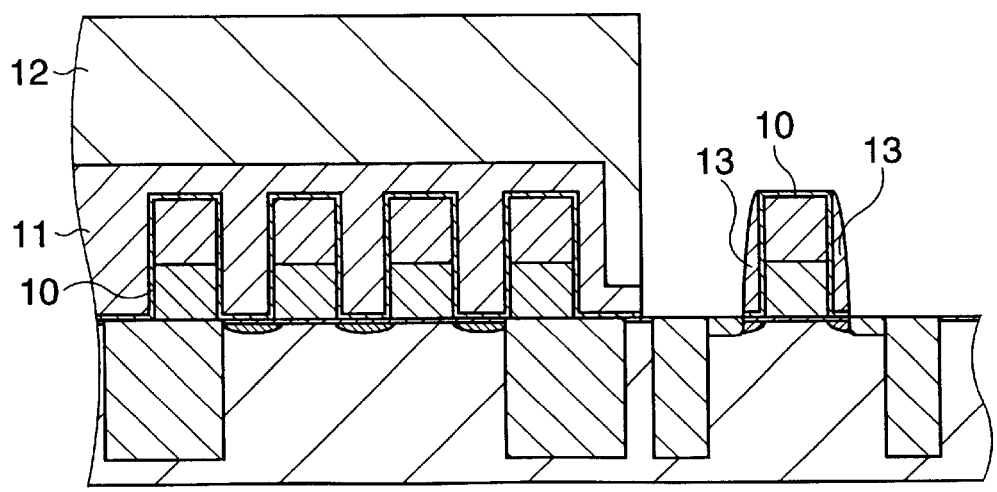

As shown in FIG. 1C, a resist mask 12 is formed to cover only the first region 3. The silicon oxide film 11 and the silicon nitride film 10 are anisotropically etched in their entire surfaces until the LDD diffusion layers 9 in the second region 4 are exposed. With this process, the LDD diffusion layers 9 are exposed, and a side wall 13 made of the silicon oxide film 11 is formed on the side surface of the gate electrode 7.

Ions are implanted into the substrate, partially inclusive the LDD diffusion layers 9, using the gate electrode 7 and the side wall 13 as a mask, thereby forming source/drain 14 (first and second impurity diffusion layers) including the LDD diffusion layers 9. In the second region 4, a transistor Tr2 having the gate electrode 7 and the source/drain 14 with an LDD structure is formed. The mask used for ion implantation is preferably commonly used to form the side wall 13. When one mask is commonly used for ion implantation and formation of the side wall 13, the number of masks and the number of steps can be decreased to enable efficient manufacture of semiconductor devices.

Figure 2A:
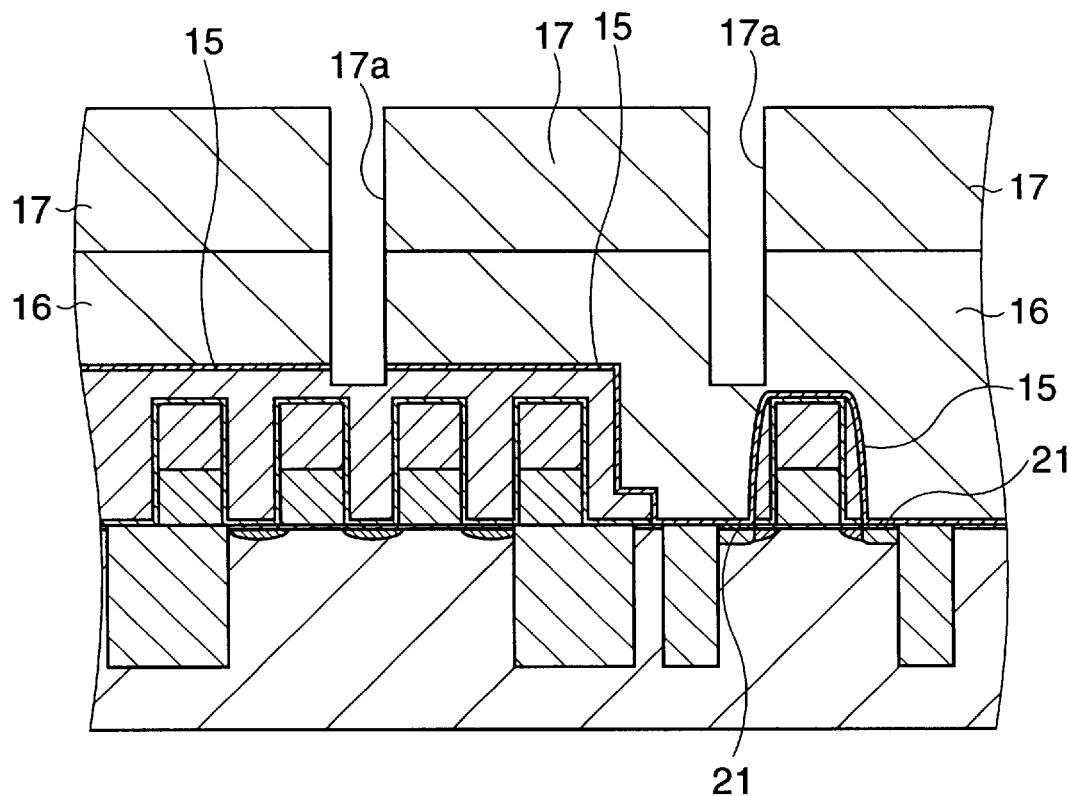
FIGS. 2A and 2B are schematic sectional views showing the method of manufacturing the semiconductor device according to the first embodiment.

Subsequently, as shown in FIG. 2A, the resist mask 12 is removed by ashing. After this, CoSi as a metal silicide 21 is selectively grown on the surfaces of the source/drain 14 to a thickness of about 10 nm by a known silicide process.

As a passivation film (second passivation film) for BLC, a silicon nitride film 15 having a thickness of about 30 nm is deposited on the entire surface by CVD such that the space between the gate electrodes 7 in the second region 4 is not filled with the total thickness of the silicon nitride film 15 and the side wall 13. A silicon oxide film having a thickness of about 600 nm is deposited by CVD to form an insulating interlayer 16 filling the spaces between the gate electrodes 6 and 7. The insulating interlayer 16 is polished by about 400 nm by CMP (Chemical Mechanical Polishing) to planarize the surface.

A photoresist 17 is applied to the entire surface of the insulating interlayer 16. Openings 17*a* are formed in the photoresist 17 by photolithography.

Using the photoresist 17 as a mask, the insulating interlayer 16 and the silicon nitride film 15 on the first region 3 side are anisotropically etched (first etching). This first etching is performed using an etching gas having a low selectivity ratio of a nitride film to an oxide film until the silicon nitride film 15 is sufficiently etched. For this reason, as shown in FIG. 2A, etching progresses at almost the same etching rate on the first region 3 side and the second region 4 side.

Figure 2B:
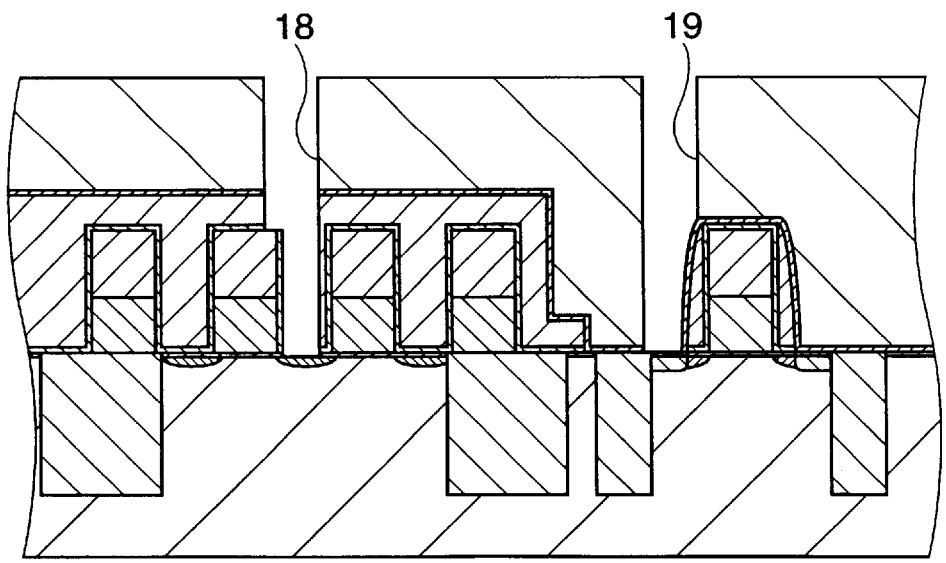

As shown in FIG. 2B, the insulating interlayer 16, silicon nitride films 10 and 15, and gate insulating film 5 are etched using an etching gas having a high selectivity ratio of a nitride film to an oxide film (second etching). Even when the interval between the gate electrodes 6 in the first region 3 is small or the contact region of the gate electrode 7 in the second region 4 is small, the gate electrodes 6 and 7 are protected from etching by the silicon nitride films 10, 15, and 31. With this process, contact holes 18 and 19 are formed to expose the surface of the LDD diffusion layer 8 functioning as source/drain in the first region 3 and the surface of the metal silicide 21 in the second region 4, respectively.

More specifically, in forming the contact hole 18, when viewed from the upper side, the silicon nitride film 10 covering the gate electrode 6 is substantially thicker than the silicon nitride film 10 covering the LDD diffusion layer 8. For this reason, the silicon nitride film 10 covering the LDD diffusion layer 8 is etched and removed before the silicon nitride film 10 covering the gate electrode 6 is etched. For the contact hole 19 as well, when viewed from the upper side, the silicon nitride film 15 covering the gate electrode 7 is substantially thicker than the silicon nitride film 15 covering the metal silicide 21. For this reason, the silicon nitride film 15 covering the metal silicide 21 is etched and removed before the silicon nitride film 15 covering the gate electrode 7 is etched.

After that, an interconnection layer filing the contact holes 18 and 19 and extending on the insulating interlayer 16, and a passivation film covering the entire surface are formed, thereby completing a semiconductor device.

As described above, according to the method of manufacturing the semiconductor device of the first embodiment, silicidation of the source and drain of the transistor in the second region and the self-alignment technique such as BLC or SAC can be simultaneously used to enable an increase in the degree of integration and improvement of performance (improvement of operation speed) of the semiconductor device having the metal silicide 21 on the transistor in the second region 4. This technique is particularly preferable in a semiconductor memory having a memory cell region as the first region 3 and a peripheral circuit region (logic circuit region) as the second region 4.

Modification

Modifications to the first embodiment will be described below. The same reference numerals as in the semiconductor device of the first embodiment denote the same members in these modifications, and a detailed description thereof will be omitted.

(First Modification)

In the first modification, in forming n- and p-type transistors in a second region 4, side walls 13 and sources and drains 14 are continuously formed.

Figure 3A:
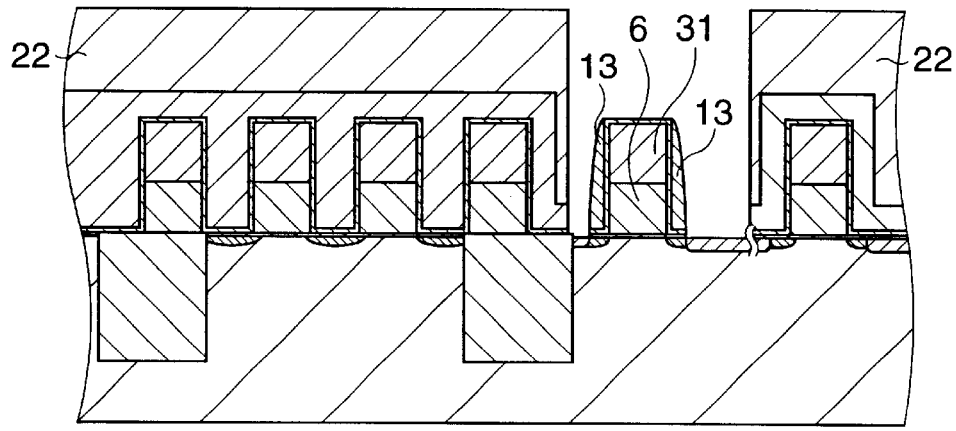
FIGS. 3A to 3C are schematic sectional views showing the first modification to the method of manufacturing the semiconductor device according to the first embodiment.

More specifically, after the steps shown in FIGS. 1A and 1B, a resist mask 22 is formed, which has an opening corresponding to only a gate electrode 7 as a prospective n-type transistor in the second region 4, as shown in FIG. 3A. After a side wall 13 is formed according to the same procedure as in FIG. 1C, n-type impurities are ion-implanted to form n-type source and drain 14.

Figure 3B:
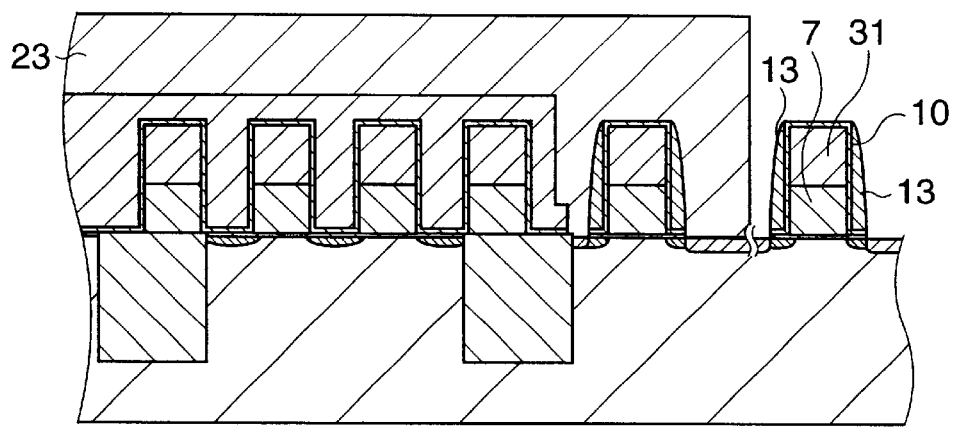

Next, as shown in FIG. 3B, after a resist mask 22 is removed by ashing, a resist mask 23 is formed, which has an opening corresponding to only the gate electrode 7 as a prospective p-type transistor in the second region 4. A side wall 13 is formed in a similar way, and then p-type impurities are ion-implanted to form p-type source and drain 14. The process (side wall formation and ion implantation) for the n-type transistor and that for the p-type transistor may be performed in a reversed order.

Figure 3C:
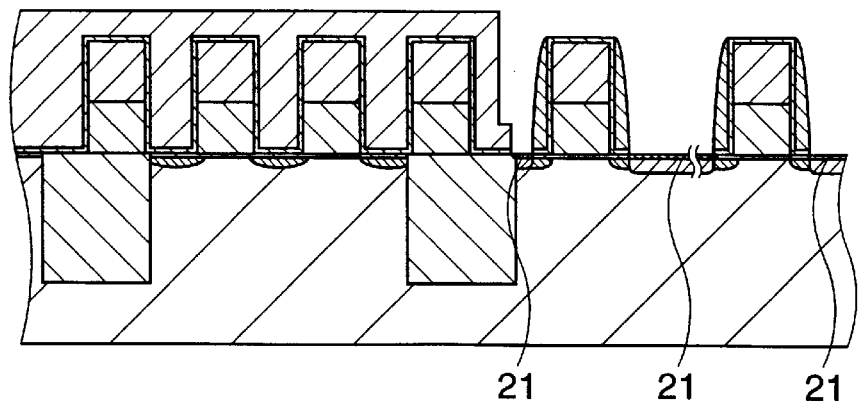

After the resist mask 23 is removed by ashing, as shown in FIG. 3C, CoSi as a metal silicide 21 is selectively grown on the surfaces of the sources and drains 14 to a thickness of about 10 nm by a known silicide process, as in FIG. 2A.

After this, the remaining steps in FIG. 2A and steps in FIG. 2C are executed to form contact holes 18 and 19.

According to the first modification, in addition to the effects described in the first embodiment, when one mask is commonly used for ion implantation and formation of the side wall 13 for each of the transistors of opposite conductivity types, the number of masks and the number of steps can be decreased to enable efficient manufacture of semiconductor devices.

(Second Modification)

In the second modification, contact holes 18 and 19 which are formed in two steps in the first embodiment are formed in one step.

Figure 4A:
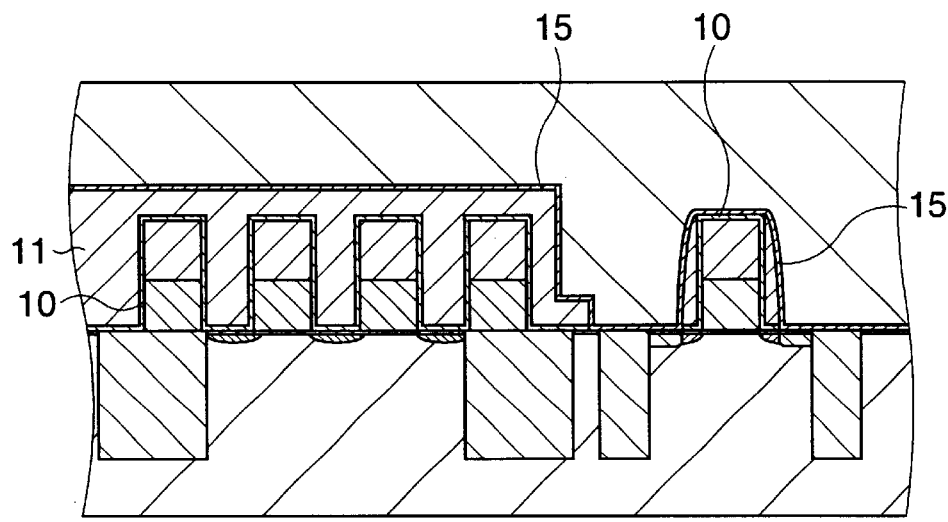
FIGS. 4A to 4C are schematic sectional views showing the second modification to the method of manufacturing the semiconductor device according to the first embodiment.

More specifically, after the steps in FIGS. 1A to 1C, a silicon nitride film 15 having a thickness of about 30 nm is formed on the entire surface as a passivation film (second passivation film) for BLC, and an insulating interlayer 16 having a thickness of about 400 nm is formed to fill the space between gate electrodes 6 and 7, as shown in FIG. 4A.

Figure 4B:
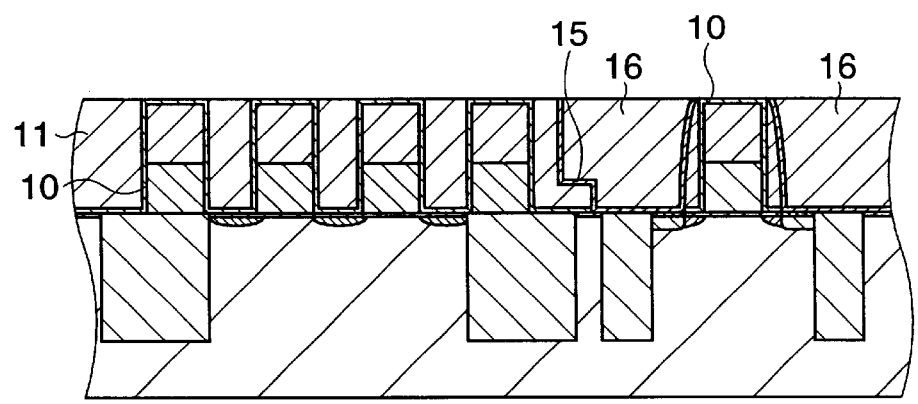

As shown in FIG. 4B, using the upper surface of the gate electrode 7 in a second region 4 as a stopper, the insulating interlayer 16 is polished by CMP until the surface of a silicon nitride film 10 on the upper surface of the gate electrode 7 appears. At this time, the silicon nitride film 10 deposited on the gate electrodes 6 on the first region 3 side is removed by polishing.

Figure 4C:
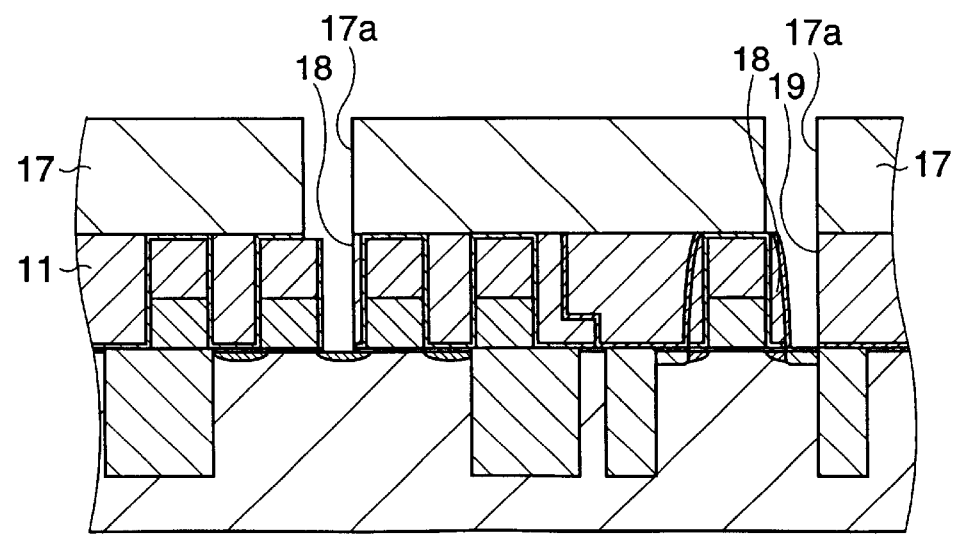

As shown in FIG. 4C, a photoresist 17 is applied to the entire surface of the insulating interlayer 16, and openings 17*a* are formed in the photoresist 17 by photolithography. Using the photoresist 17 as a mask, the insulating interlayer 16 and the underlying silicon nitride films 10 and 15 and gate insulating film 5 are anisotropically etched using an etching gas having a high selectivity ratio of a nitride film to an oxide film. With this process, contact holes 18 and 19 are formed to expose the surface of an LDD diffusion layer 8 functioning as source/drain in the first region 3 and the surface of a metal silicide 21 in the second region 4, respectively.

According to the second modification, in addition to the effects described in the first embodiment, the silicon nitride film 15 on the first region 3 side is removed in forming the contact holes 18 and 19. For this reason, the contact holes 18 and 19 can be simultaneously formed by anisotropic etching in one step. This shortens the process time and simplifies the process.

(Third Modification)

In the third modification, contact holes 18 and 19 which are formed in two steps in the first embodiment are formed in one step, as in the second modification.

Figure 5A:
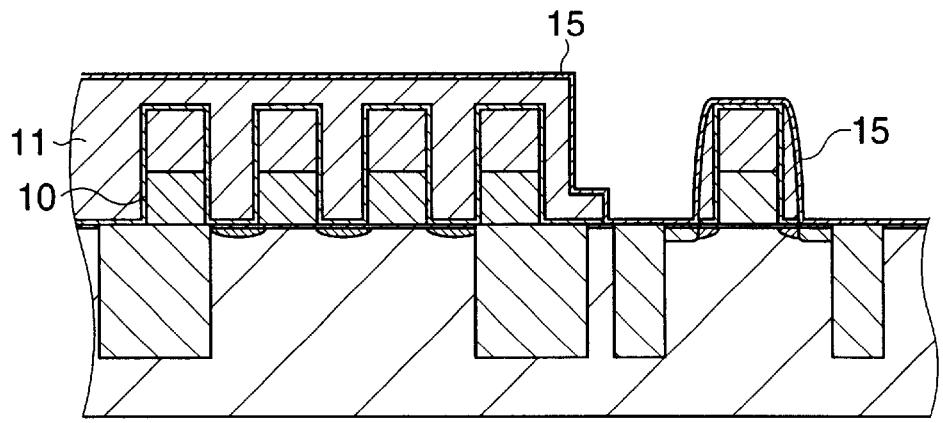
FIGS. 5A to 5C are schematic sectional views showing the third modification to the method of manufacturing the semiconductor device according to the first embodiment.

More specifically, after the steps in FIGS. 1A to 1C, a silicon nitride film 15 having a thickness of about 30 nm is deposited on the entire surface as a passivation film (second passivation film) for BLC, as shown in FIG. 5A.

Figure 5B:
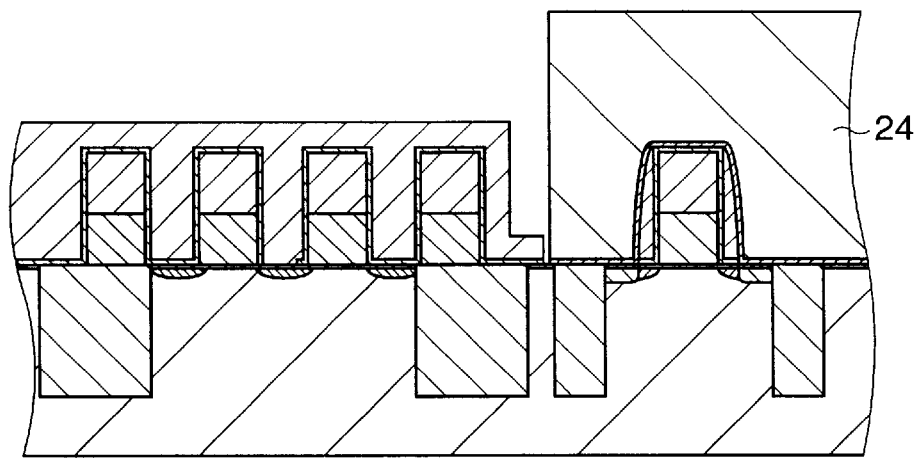

As shown in FIG. 5B, a resist mask 24 is formed to cover the structure on the second region 4 side and isotropically etched using a predetermined wet etchant such as hydrofluoric acid, thereby removing the silicon nitride film 15 covering the structure on the first region 3 side.

Figure 5C:
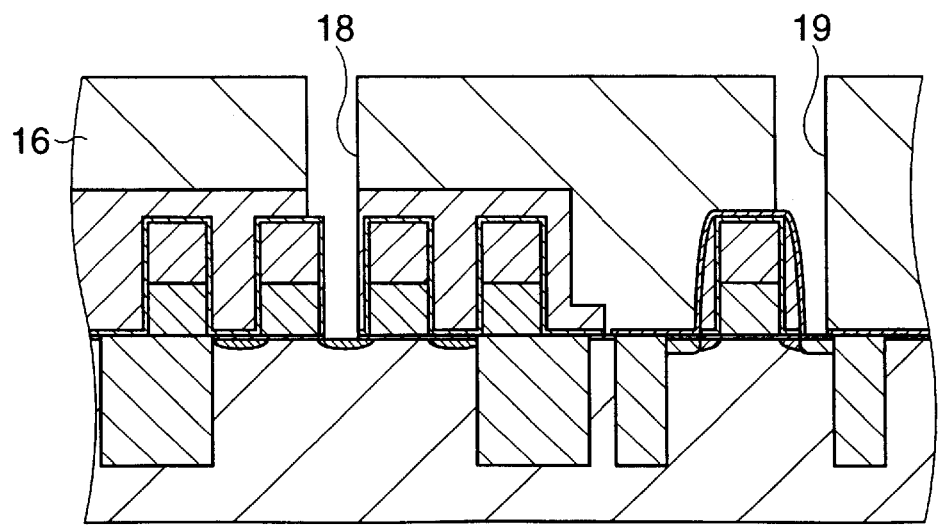

As shown in FIG. 5C, an insulating interlayer 16 is formed to fill the space between the gate electrodes 6 and 7. Using a photoresist 17 as a mask, the insulating interlayer 16 and the underlying silicon nitride films 10 and 15 and gate insulating film 5 are anisotropically etched using an etching gas having a high selectivity ratio of a nitride film to an oxide film. With this process, contact holes 18 and 19 are formed to expose the surface of an LDD diffusion layer 8 functioning as source/drain in the first region 3 and the surface of a metal silicide 21 in the second region 4, respectively.

According to the third modification, in addition to the effects described in the first embodiment, the silicon nitride film 15 on the first region 3 side is removed in forming the contact holes 18 and 19. For this reason, the contact holes 18 and 19 can be simultaneously formed by anisotropic etching in one step. This shortens the process time and simplifies the process.

(Second Embodiment)

In the second embodiment of the present invention, an example in which the first embodiment is applied to a DRAM having a peripheral circuit (logic circuit) region will be described. In this embodiment, for the descriptive convenience, the structure of the DRAM and the manufacturing method thereof will be described together.

Figure 6:
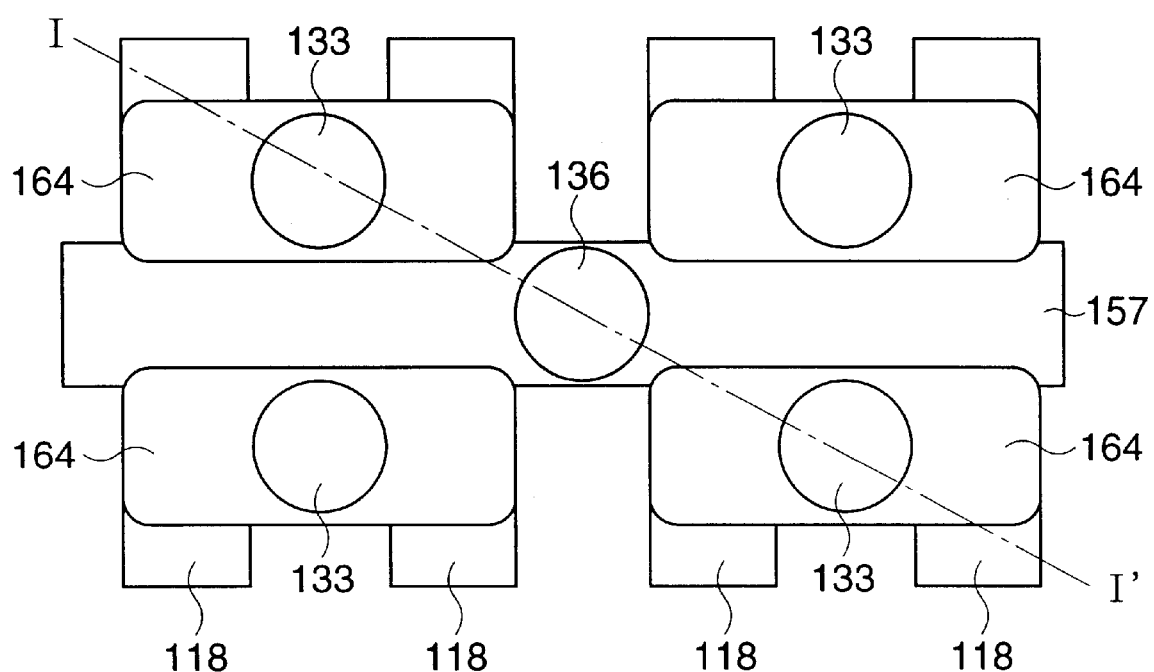
FIG. 6 is a schematic plan view showing a DRAM according to the second embodiment of the present invention.

FIG. 6 is a schematic plan view showing the DRAM according to the second embodiment. FIGS. 7A to 13 are schematic sectional views (taken along a line I–I' in FIG. 6) showing steps in manufacturing the DRAM according to the second embodiment.

Figure 7A:
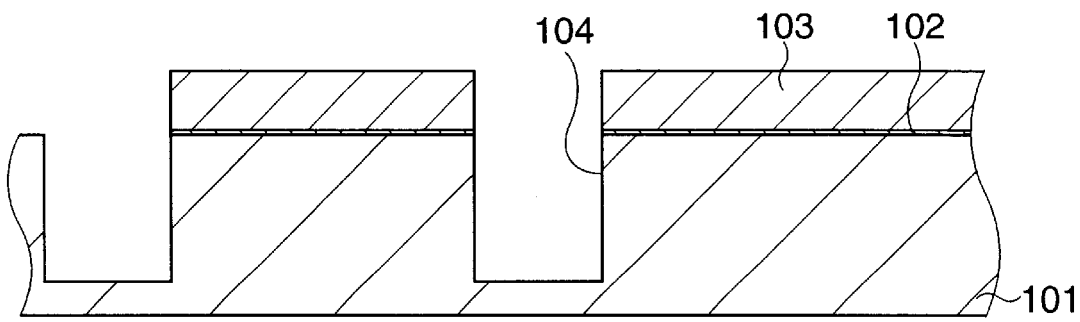
FIGS. 7A to 7C are schematic sectional views showing steps in manufacturing the DRAM according to the second embodiment.

First, as shown in FIG. 7A, to define an element active region on the surface of a p-type silicon semiconductor substrate 101, an initial oxide film 102 having a thickness of about 10 nm is formed on the semiconductor substrate 101 by thermal oxidation at about 850° C. Next, a silicon nitride film 103 having a thickness of approximately 150 nm is deposited by CVD. A resist mask (not shown) having an opening corresponding to the element isolation region is formed. The silicon nitride film 103 and initial oxide film 102, and then the semiconductor substrate 101 are anisotropically etched by about 300 nm to form a trench 104 in accordance with the element isolation region.

Figure 7B:
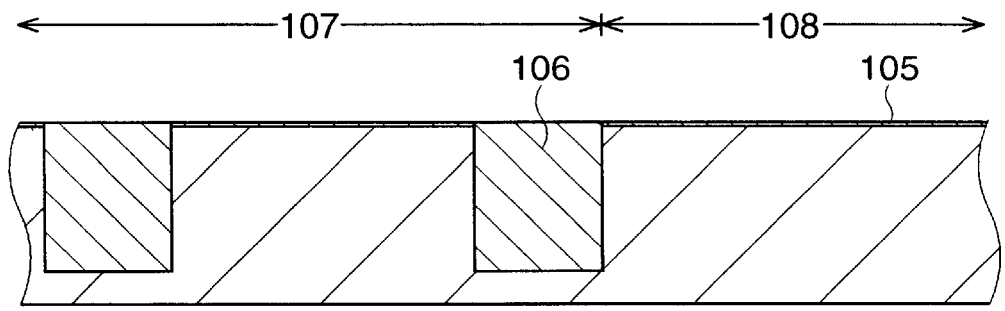

As shown in FIG. 7B, a silicon oxide film having a thickness of about 600 nm is deposited by CVD to fill the trench 104. After this silicon oxide film is polished by about 150 nm by CMP using the silicon nitride film 103 as a stopper, the silicon nitride film 103 is removed. A sacrificial oxide film 105 having a thickness of about 10 nm is formed on the surface of the semiconductor substrate 101 by thermal oxidation at about 850° C., thereby forming a trench-type element isolation structure 106 having the trench 104 filled with the silicon oxide film. At this time, the element isolation structure 106 defines an element active region so a memory cell region 107 as the first region and a peripheral circuit region (logic circuit region) 108 as the second region are formed.

Figure 7C:
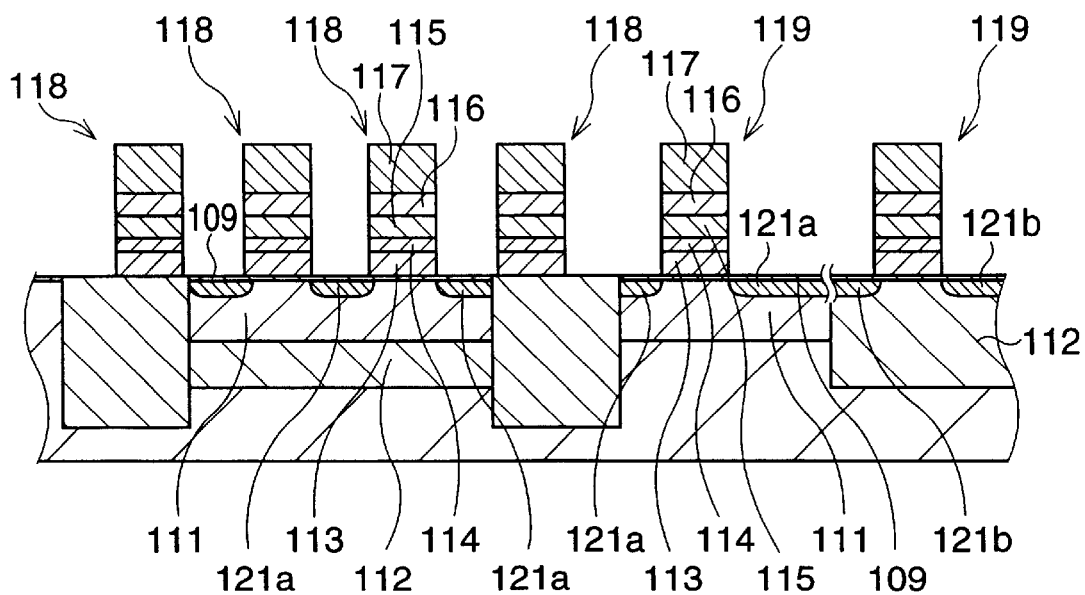

As shown in FIG. 7C, p-type impurities (B: boron) and n-type impurities (P: phosphorus) are ion-implanted into both the memory cell region 107 and the peripheral circuit region 108 through the sacrificial oxide film 105 at acceleration energies of 200 KeV and 800 KeV and doses of $1\times10^{13}/cm^2$ and $1\times10^{13}/cm^2$, respectively, to form a p-well region 111 and an n-well region 112.

Ion implantation for threshold value (Vth) control of transistors is performed next. For example, in the memory cell region 107, boron ions are implanted at an acceleration energy of 20 KeV and a dose of $1\times10^{13}/cm^2$.

After the sacrificial oxide film 105 is removed, a gate insulating film 109 having a thickness of about 10 nm is formed on the surface in the memory cell region 107 and the peripheral circuit region 108 by thermal oxidation at about 850° C.

A 70 nm-thick DASI (Doped Amorphous Silicon) film 113, a 30 nm-thick barrier metal film 114, a 40 nm-thick metal film 115, 40 nm-thick silicon oxynitride film 116 serving as an anti-reflection film, and a 120 nm-thick SAC silicon nitride film 117 are sequentially formed. These films are subjected to photolithography and subsequent etching to form gate electrodes 118 and 119 by patterning. The gate electrodes 118 are formed in the memory cell region 107, and the gate electrodes 119 are formed in the peripheral circuit region 108. FIG. 7C shows the gate electrodes 118 and 119 across the element isolation structure 106. These gate electrodes are formed from the element active region to the element isolation region and only appear to be formed on the element isolation structure 106 in this sectional view.

Next, ions are implanted into the p-well region 111 and the n-well region 112 to form LDD diffusion layers 121a and 121b (first impurity diffusion layers). In the memory cell region 107, the gate electrodes 118 and the LDD diffusion layers 121a functioning as a source and a drain construct a transistor Tr1.

Figure 8A:
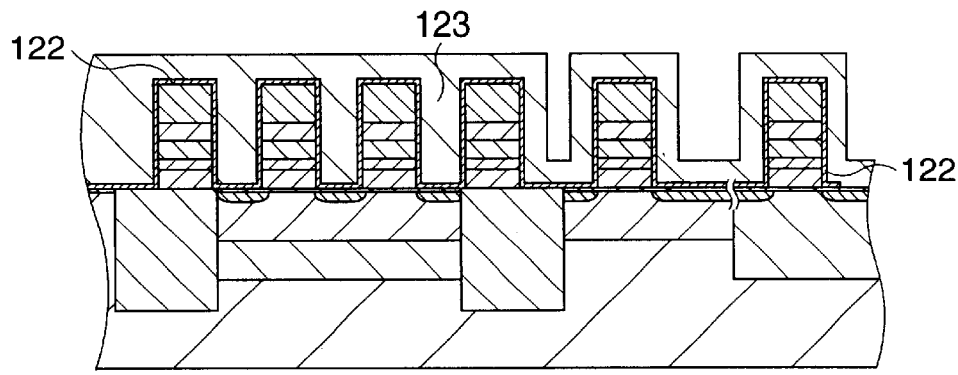
FIGS. 8A to 8C are schematic sectional views showing steps in manufacturing the DRAM according to the second embodiment.

As shown in FIG. 8A, after a silicon nitride film 122 having a thickness of about 30 nm is formed on the entire surface by CVD as a SAC passivation film, a silicon oxide film 123 having a thickness of about 50 nm is formed for side wall formation. The space between the adjacent gate electrodes 118 (interval: 0.15 μm or less) in the memory cell region 107 is filled with the silicon oxide film 123.

Figure 8B:
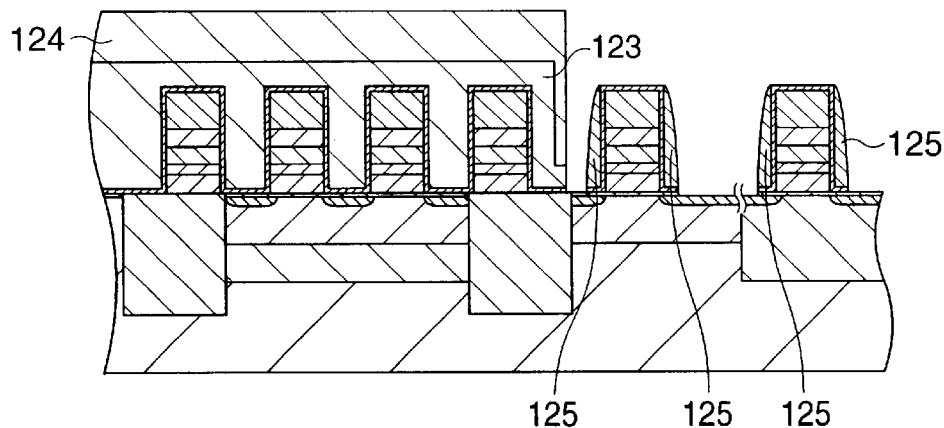

As shown in FIG. 8B, a photoresist is applied, and a resist mask 124 is formed by photolithography to cover the memory cell region 107. The entire surface of the structure is anisotropically etched until the surfaces of the LDD diffusion layers 121 in the peripheral circuit region 108 are exposed, thereby forming side walls 125 formed from the silicon oxide film 123 on the side surfaces of the gate electrodes 119 in the peripheral circuit region 108.

Figure 8C:
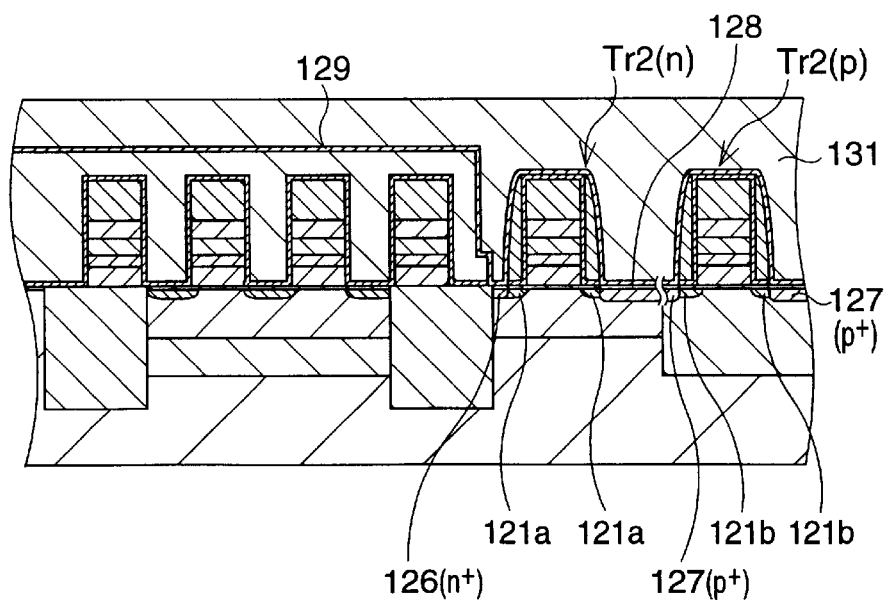

As shown in FIG. 8C, the resist mask 124 is removed by ashing. Impurities of n-and p-types are ion-implanted into the n-and p-channel sides of the peripheral circuit region 108 to form sources and drains 126($n^+$) and 127($p^+$) (first and second impurity diffusion layers) joined to the LDD diffusion layers 121a and 121b, respectively. In the peripheral circuit region 108, an n-type transistor Tr2(n) comprising the gate electrode 119 and source/drain 126($n^+$) and a p-type transistor Tr2(p) comprising the gate electrode 119 and source/drain 127($p^+$) are formed.

CoSi as a metal silicide 128 is selectively grown on the exposed surfaces of the source/drain 126($n^+$) and the source/drain 127($p^+$) in the peripheral circuit region 108 to a thickness of about 10 nm by a known silicide process.

As a BLC passivation film, a silicon nitride film 129 having a thickness of about 30 nm is deposited on the entire surface by CVD such that the space between the gate electrodes 119 in the peripheral circuit region 108 is not filled with the total thickness of the silicon nitride film 129 and the side wall 125. A silicon oxide film having a thickness of about 600 nm is deposited to form an insulating interlayer 131 filling the spaces between the gate electrodes 118 and 119. The insulating interlayer 131 is polished by about 400 nm by CMP (Chemical Mechanical Polishing) to planarize the surface.

Subsequently, contact holes (storage electrode contact holes) for memory capacitors of the DRAM are formed.

Figure 9A:
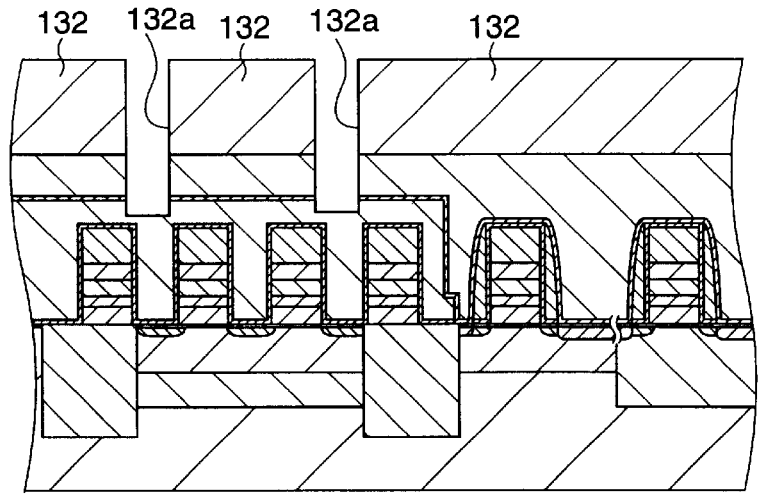
FIGS. 9A to 9C are schematic sectional views showing steps in manufacturing the DRAM according to the second embodiment.

As shown in FIG. 9A, a photoresist 132 is applied to the entire surface of the insulating interlayer 131, and openings 132a for drain contact formation are formed in the photoresist 132 by photolithography.

Using the photoresist 132 as a mask, the insulating interlayer 131 and the silicon nitride film 129 in the memory cell region 107 are anisotropically etched (first etching). Using an etching gas having a low selectivity ratio of a nitride film to an oxide film, the first etching is performed to such a depth (about 300 nm) that the silicon nitride film 129 is sufficiently etched.

Figure 9B:
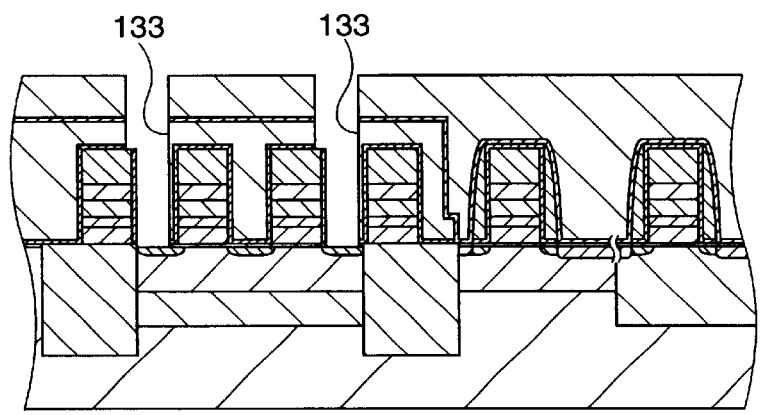

As shown in FIG. 9B, the insulating interlayer 131 and the gate insulating film 109 are etched using an etching gas having a high selectivity ratio of a nitride film to an oxide film (second etching). Even when the interval between the gate electrodes 118 in the memory cell region 107 is small, the gate electrodes 118 are protected from etching by the silicon nitride film 129. With this process, contact holes 133 are formed in the memory cell region 107 to expose the surfaces of the LDD diffusion layers 121a functioning as a source and a drain.

Figure 9C:
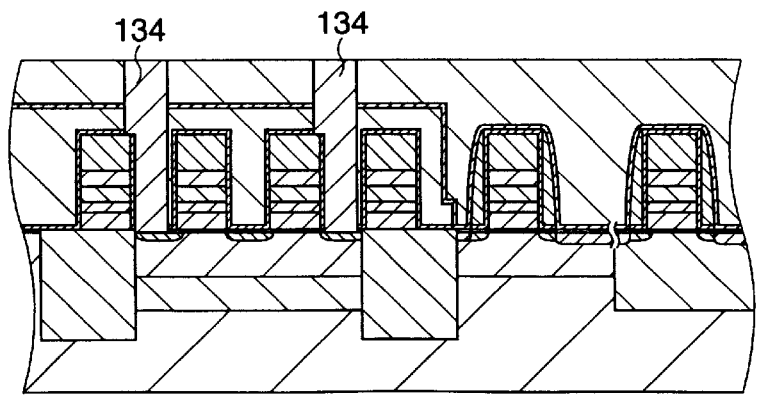

After the photoresist 132 is removed by ashing, DASI is deposited to a thickness of approximately 150 nm such that the contact holes 133 are sufficiently filled, as shown in FIG. 9C. The DASI film is polished by CMP until the surface of the insulating interlayer 131 is exposed, thereby forming contact plugs 134 that fill the contact holes 133 with DASI.

Subsequently, the bit contact hole of the transistor Tr1 is formed in the memory cell region 107, and the source/drain contact hole of the transistors Tr2(n) and Tr2(p) is formed in the peripheral circuit region 108.

Figure 10A:
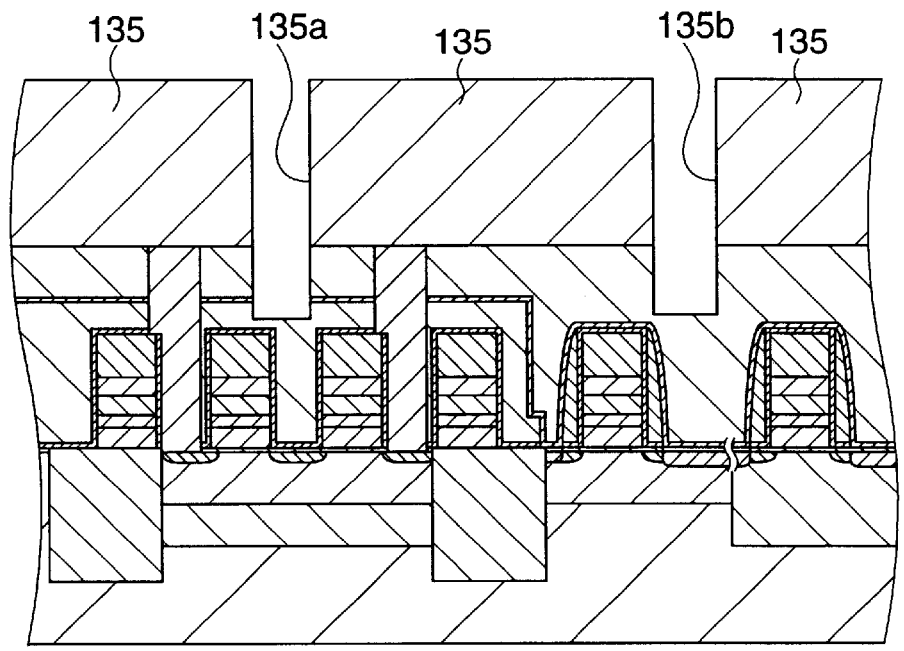
FIGS. 10A and 10B are schematic sectional views showing steps in manufacturing the DRAM according to the second embodiment.

As shown in FIG. 10A, a photoresist 135 is applied to the entire surface of the insulating interlayer 131, and an opening 135a for bit contact formation and an opening 135b for source/drain contact formation are formed in the photoresist 135 by photolithography.

Using the photoresist 135 as a mask, the insulating interlayer 131 and the silicon nitride film 129 in the memory cell region 107 and the insulating interlayer 131 in the peripheral circuit region 108 are anisotropically etched (first etching). Using an etching gas having a low selectivity ratio of a nitride film to an oxide film, the first etching is performed to such a depth (about 300 nm) that the silicon nitride film 129 is sufficiently etched.

Figure 10B:
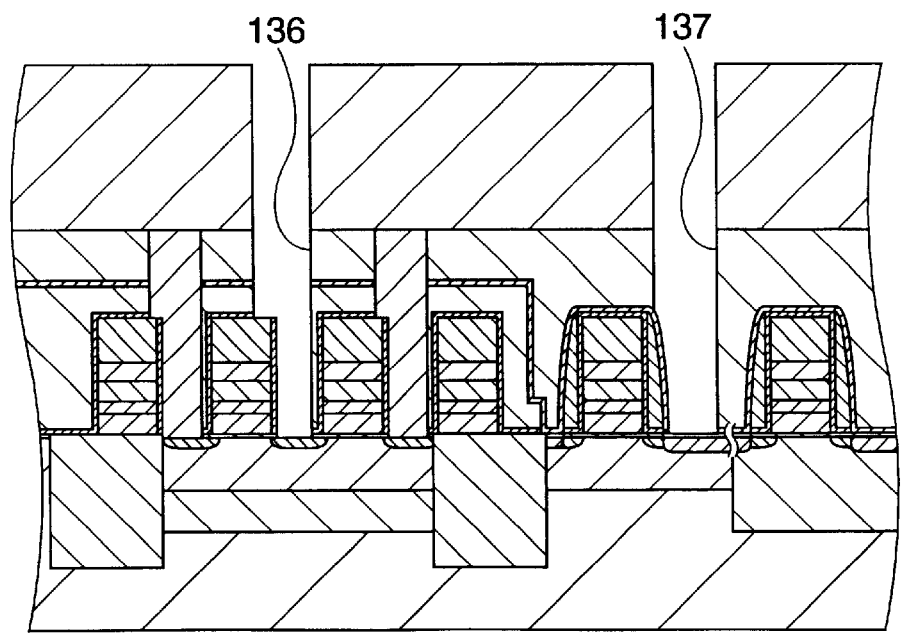

As shown in FIG. 10B, the insulating interlayer 131 and the gate insulating film 109 are etched using an etching gas having a high selectivity ratio of a nitride film to an oxide film (second etching). Even when the interval between the gate electrodes 118 in the memory cell region 107 is small or the interval between the gate electrodes 119 in the peripheral circuit region 108 is small, the gate electrodes 118 and 119 are protected from etching by the silicon nitride films 122 and 129. With this process, a contact hole (bit contact hole) 136 is formed in the memory cell region 107 to expose the surface of the LDD diffusion layer 121 functioning as source/drain, and a contact hole (source/drain contact hole) 137 is formed in the peripheral circuit region 108 to expose the surface of the metal silicide 128.

Figure 11A:
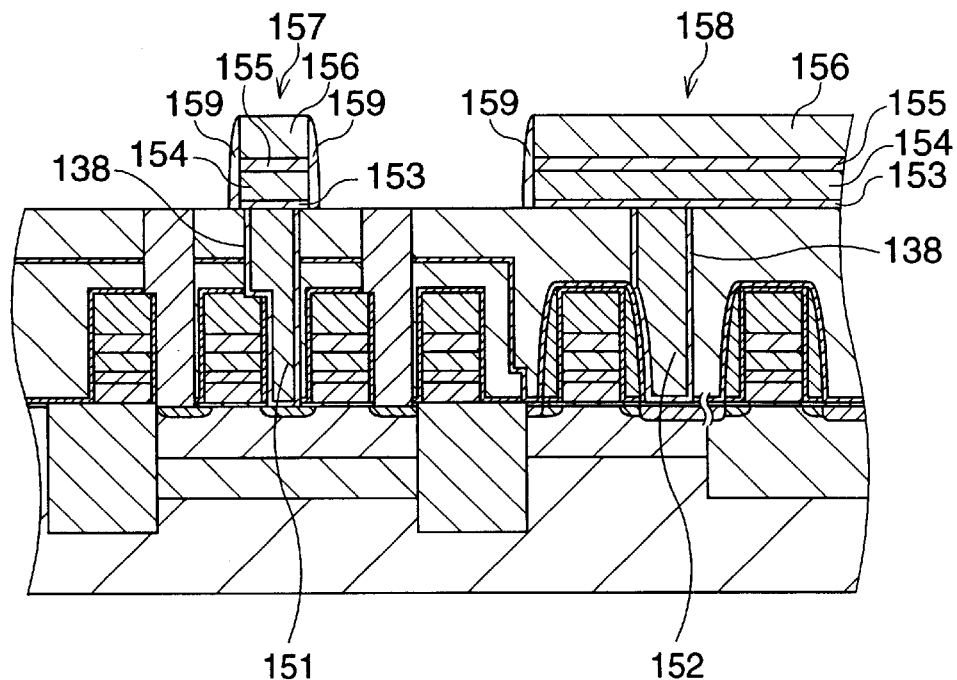

After the photoresist 135 is removed by ashing, a barrier metal film 138 having a thickness of about 30 nm is formed to cover the inner surfaces of the contact holes 136 and 137, as shown in FIG. 11A. A metal film is formed to sufficiently fill the contact holes 136 and 137 and then polished by CMP until the surface of the insulating interlayer 131 is exposed, thereby forming contact plugs 151 and 152 that fill the contact holes 136 and 137 with the metal film, respectively.

Next, a 30 nm-thick barrier metal film 153, a 80 nm-thick metal film 154, a 50 nm-thick silicon oxynitride film 155 and serving as an anti-reflection film, and a 130 nm-thick silicon nitride film 156 are sequentially formed on the insulating interlayer 131. These films are patterned by photolithography and subsequent etching to form a bit line 157 connected to the contact plug 151 and an interconnection layer 158 connected to the contact plug 152.

A silicon nitride film having a thickness of about 30 nm is deposited on the entire surface. After that, the entire surface is anisotropically etched to form a side wall 159 on the side surface of each of the bit line 157 and the interconnection layer 158.

Figure 11B:
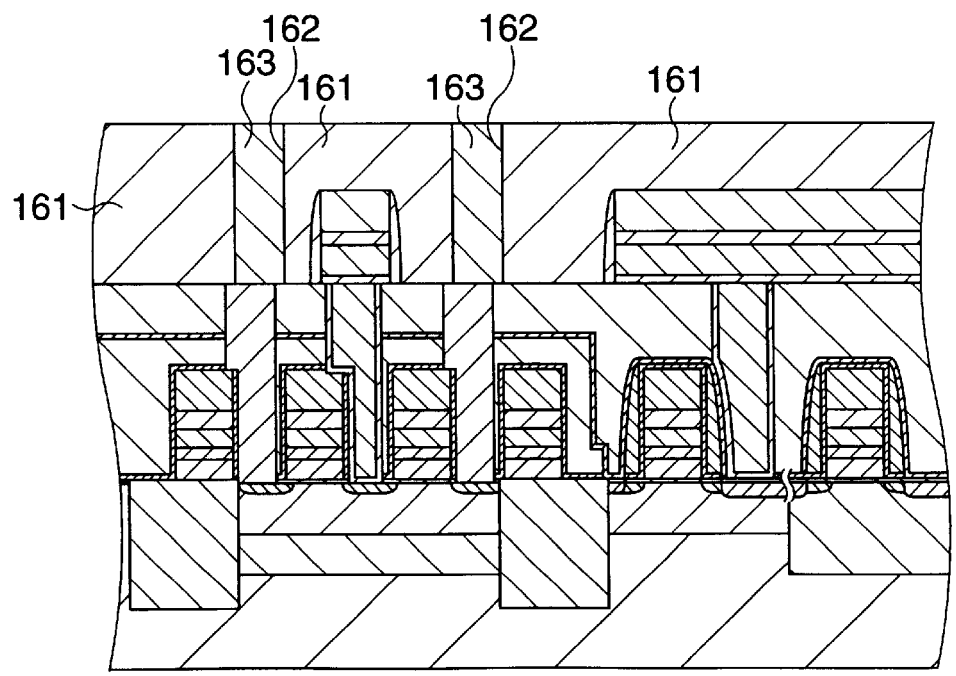

A memory capacitor 171 connected to the LDD diffusion layer 121 of a transistor 141 in the memory cell region 107 through the contact plug 134 is formed next. As shown in FIG. 11B, a silicon oxide film having a thickness of about 600 nm is deposited to bury the bit line 157 and the interconnection layer 158 to form an insulating interlayer 161. The surface is polished and planarized by CMP.

To connect the contact plugs 134, openings are formed in the insulating interlayer 161 by photolithography and subsequent etching to form contact holes 162.

DASI is deposited to a thickness of about 150 to sufficiently fill the contact holes 162 and polished by CMP until the surface of the insulating interlayer 161 is exposed, thereby forming contact plugs 163 that fill the contact holes 162 with DASI and are connected to the contact plugs 134.

Figure 12:
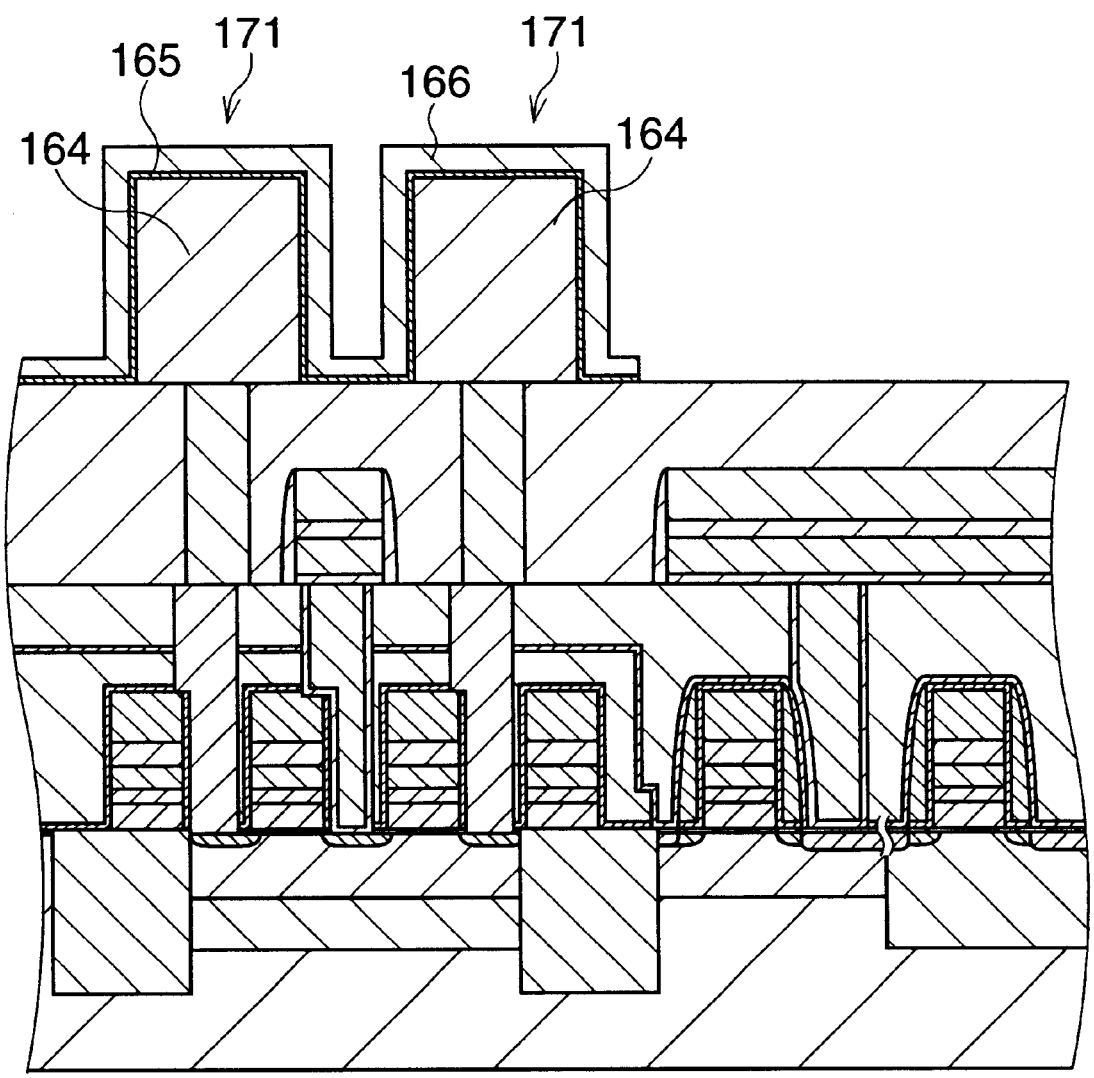
FIG. 12 is a schematic sectional view showing a step in manufacturing the DRAM according to the second embodiment.

As shown in FIG. 12, DASI is deposited on the insulating interlayer 161 to a thickness of about 700 nm and patterned by photolithography and subsequent etching to form storage node electrodes 164 connected to the contact plugs 163.

TaO, SiN, or SiON is deposited to a thickness of about 5 nm by CVD to form a dielectric film 165 that covers the storage node electrodes 164. After that, DASI is deposited to a thickness of about 100 nm. The DASI and the underlying dielectric film 165 are patterned by photolithography and subsequent etching to form cell plate electrodes 166. The memory capacitors 171 in which the storage node electrode 164 and the cell plate electrode 166 are capacitively coupled through the dielectric film 165 are completed.

An upper interconnection layer 181 is formed by patterning.

Figure 13:
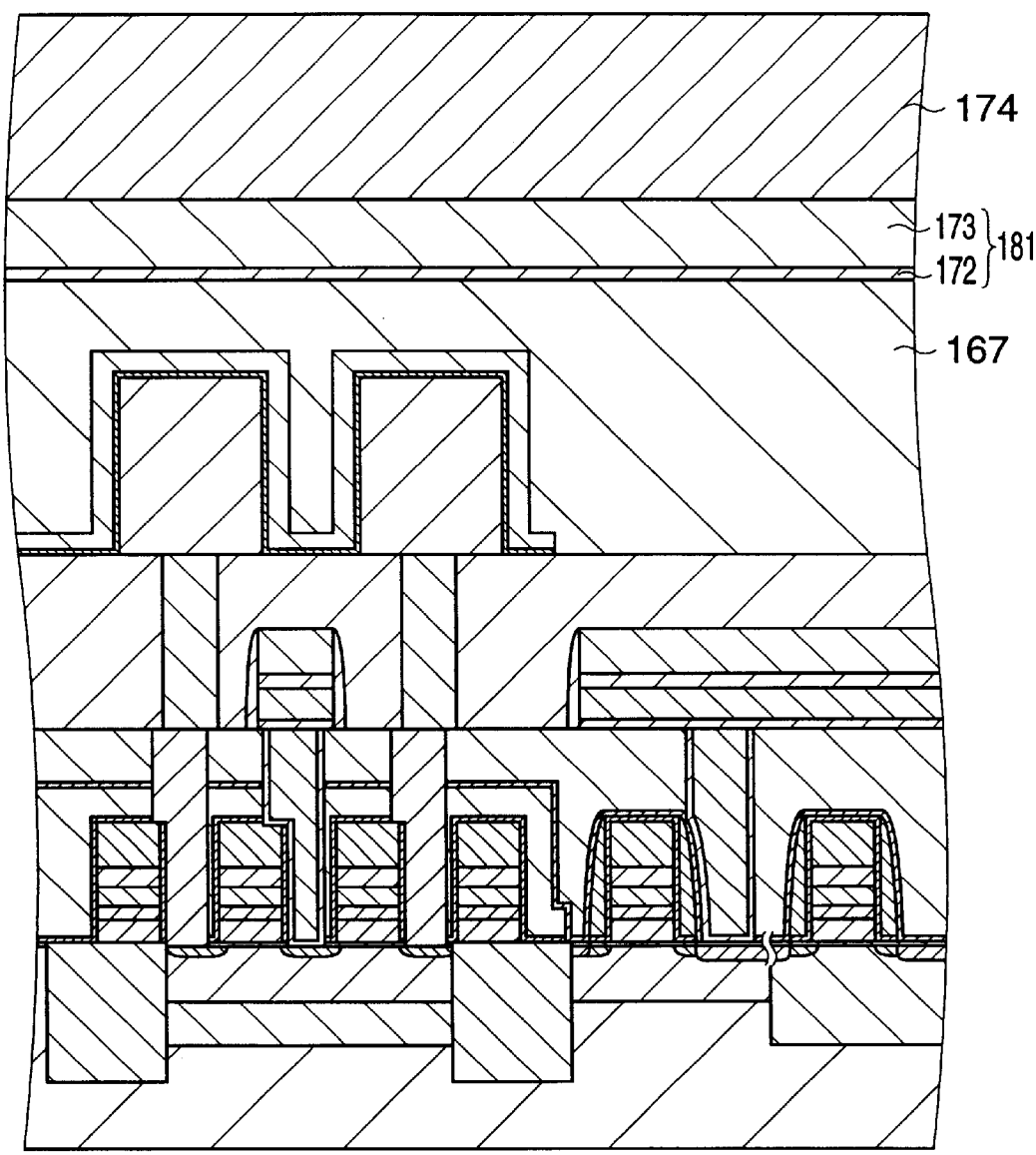
FIG. 13 is a schematic sectional view showing a step in manufacturing the DRAM according to the second embodiment.

As shown in FIG. 13, a silicon oxide film having a thickness of about 1,000 nm is deposited to form an insulating interlayer 167 which buries the memory capacitors 171. The surface is polished and planarized by CMP.

Contact holes connected to the bit lines 157 and 158 shown in FIG. 13 are formed in the insulating interlayers 167 and 161, and a metal film (metal film, contact holes, and barrier metal film are not shown) that fills the contact holes through a barrier metal, as in the contact plugs 151 and 152, are formed.

A 30 nm-thick barrier metal film 172 and a 400 nm-thick metal film 173 are sequentially formed and patterned by photolithography and subsequent etching to form the upper interconnection layer 181. After that, a passivation film 174 is formed to cover the entire surface, thus completing a DRAM.

The present invention is not limited to the above embodiment. For example, although the upper interconnection layer 181 is formed from a single layer, an interconnection layer having a multilayered structure having two or more layers may be formed. The present invention can apply not only to a DRAM but also a nonvolatile semiconductor memory such as a flash memory.

As described above, according to the DRAM manufacturing method of this embodiment, silicidation of the sources and the drains of the transistors Tr2(n) and Tr2(p) in the peripheral circuit region 108 and the self-alignment technique such as BLC or SAC can be simultaneously used to enable an increase in the degree of integration and improvement of performance (improvement of operation speed) of the DRAM having the metal silicide 21 on the transistors Tr2(n) and Tr2(p) in peripheral circuit region 108.
Modification Modifications to the second embodiment will be described below. The same reference numerals as in the semiconductor device of the second embodiment denote the same members in these modifications, and a detailed description thereof will be omitted.

(First Modification)

In the first modification, in forming n- and p-type transistors Tr2(n) and Tr2(p) in a peripheral circuit region 108, side walls 125 and source/drain 126($n^+$) and source/drain 127($p^+$) are continuously formed.

Figure 14A:
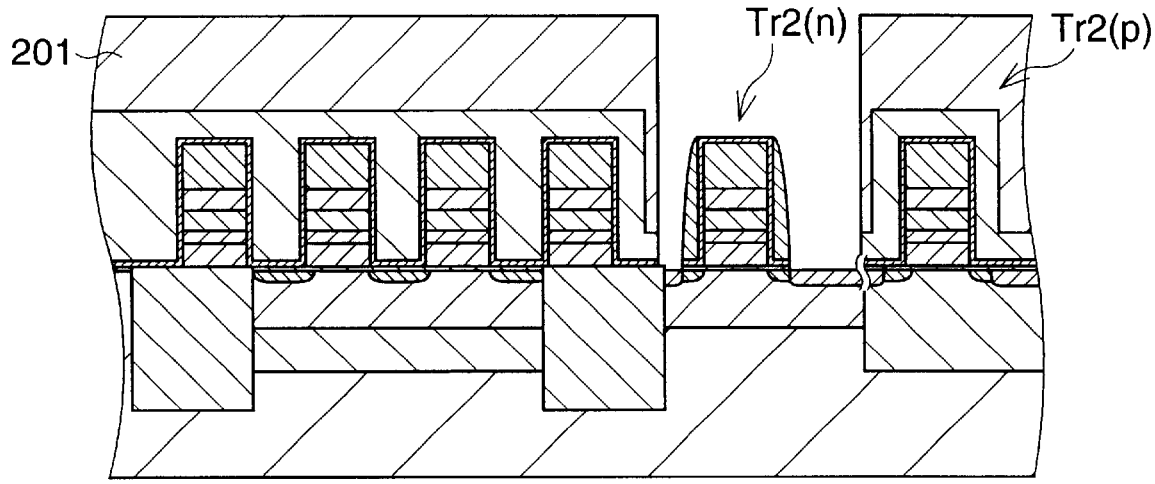
FIGS. 14A and 14B are schematic sectional views showing the first modification to the method of manufacturing the semiconductor device according to the second embodiment.

More specifically, after the steps shown in FIGS. 7A to 7C and 8A, a resist mask 201 is formed, which has an opening corresponding to only a gate electrode 119 as a prospective n-type transistor Tr2(n) in a peripheral circuit region 108, as shown in FIG. 14A. After a side wall 125 is formed according to the same procedure as in FIG. 8B, n-type impurities are ion-implanted to form n-type source/drain 126($n^+$).

Figure 14B:
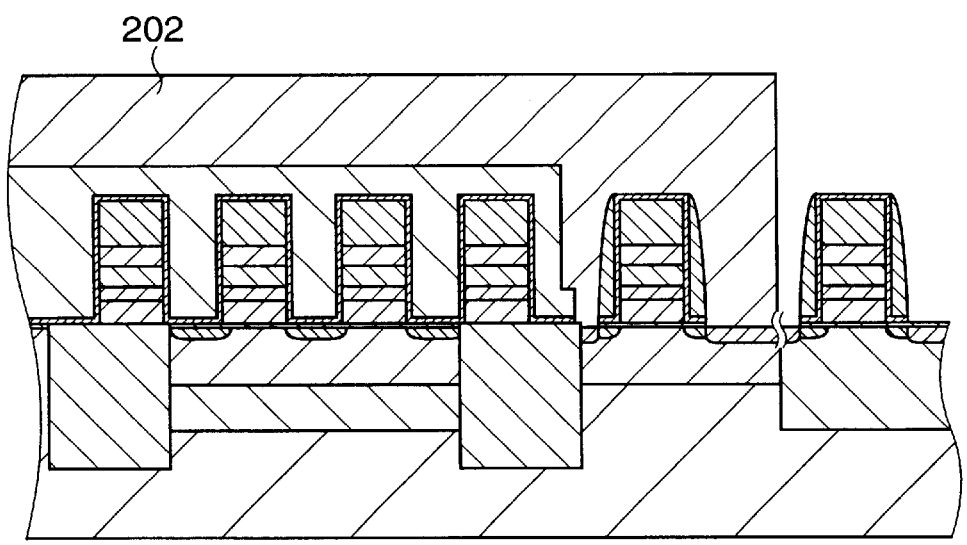

Next, as shown in FIG. 14B, after the resist mask 201 is removed by ashing, a resist mask 202 is formed, which has an opening corresponding to only the gate electrode 119 as a prospective p-type transistor Tr2($p^+$) in the peripheral circuit region 108. A side wall 125 is formed in a similar way, and then p-type impurities are ion-implanted to form p-type source/drain 127($p^+$). The process (side wall formation and ion implantation) for the n-type transistor and that for the p-type transistor may be performed in a reversed order.

After the resist mask 202 is removed by ashing, CoSi as a metal silicide 128 is selectively grown on the surfaces of the sources and drains 126($n^+$) and 127($p^+$) to a thickness of about 10 nm by a known silicide process, as in FIG. 8C. After that, an insulating interlayer 131 is formed, and its surface is planarized.

After this, the steps in FIGS. 9A to 13 are executed to complete a DRAM.

According to the first modification, in addition to the effects described in the second embodiment, when one mask is commonly used for ion implantation and formation of the side wall 125 for each of the transistors Tr2(n) and Tr2(p) of opposite conductivity types, the number of masks and the number of steps can be decreased to enable efficient manufacture of DRAMs.

(Second Modification)

In the second modification, contact holes 133 for memory capacitors, which are formed in two steps in the second embodiment, are formed in one step.

More specifically, after the steps in FIGS. 7A to 7C, 8A, and 8B, a silicon nitride film 129 having a thickness of about 30 nm is formed on the entire surface as a passivation film for BLC, and an insulating interlayer 131 having a thickness of about 600 nm is formed to fill the spaces between gate electrodes 118 and 119, as in FIG. 8C.

Figure 15A:
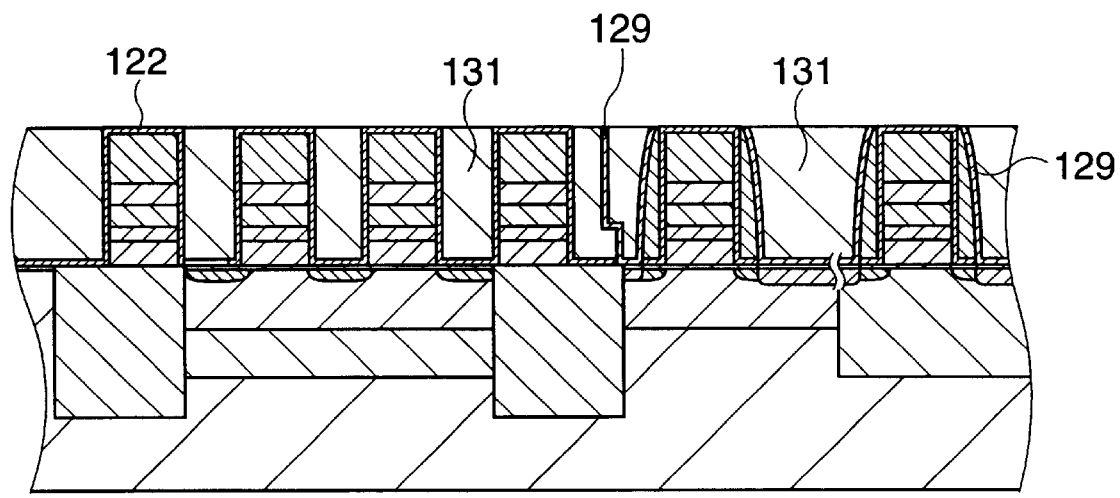
FIGS. 15A and 15B are schematic sectional views showing the second modification to the method of manufacturing the semiconductor device according to the second embodiment.

As shown in FIG. 15A, using the upper surfaces of the gate electrodes 118 and 119 in a peripheral circuit region 108 as a stopper, the insulating interlayer 131 is polished by CMP until the surface of a silicon nitride film 122 on the upper surfaces of the gate electrodes 118 and 119 appears. At this time, a silicon nitride film 129 deposited on the gate electrodes 118 on the memory cell region 107 side is removed by polishing.

Figure 15B:
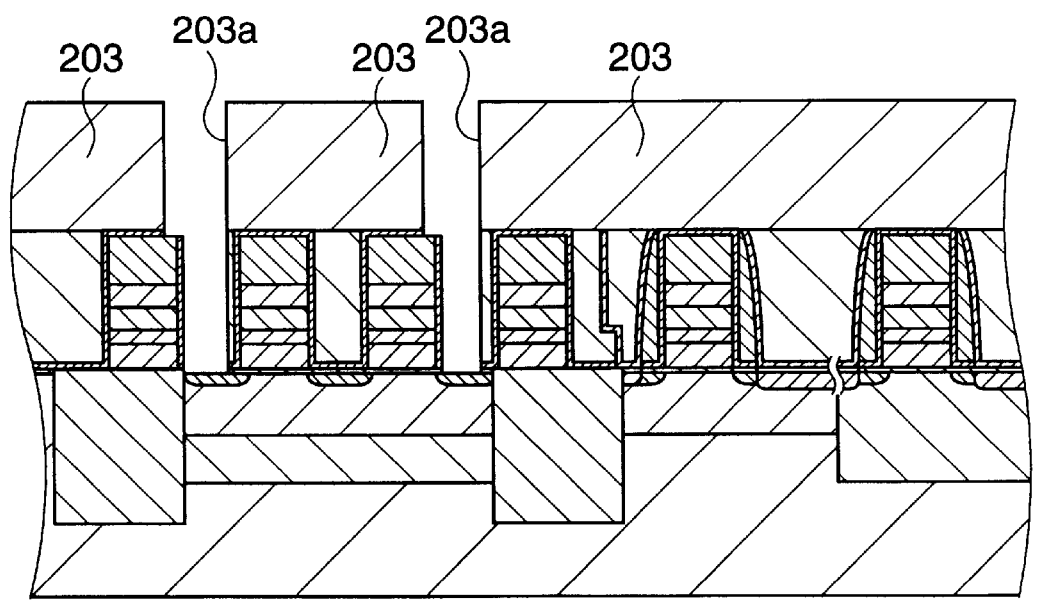

As shown in FIG. 15B, a photoresist 203 is applied to the entire surface of the insulating interlayer 131, and openings 203a are formed in the photoresist 203 by photolithography. Using the photoresist 203 as a mask, the insulating interlayer 131 and the underlying silicon nitride films 122 and 129 and the gate insulating film 109 are anisotropically etched using an etching gas having a high selectivity ratio of a nitride film to an oxide film. With this process, contact holes 133 are formed in a memory cell region 107 to expose the surfaces of an LDD diffusion layers 121 functioning as a source and drain.

Contact holes 136 and 137 can also be formed in one step by anisotropic etching using an etching gas having a high selectivity ratio of a nitride film to an oxide film.

After that, the steps in FIGS. 11A to 13 are executed to complete a DRAM.

According to the second modification, in addition to the effects described in the second embodiment, the silicon nitride film 129 on the memory cell region 107 side is removed in forming the contact holes 133. For this reason, the contact holes 133 can be simultaneously formed by anisotropic etching in one step, and the contact holes 136 and 137 can also be formed by anisotropic etching in one step. This shortens the process time and simplifies the process.

(Third Modification)

In the third modification, contact holes 133 which are formed in two steps in the second embodiment are formed in one step, as in the second modification.

Figure 16A:
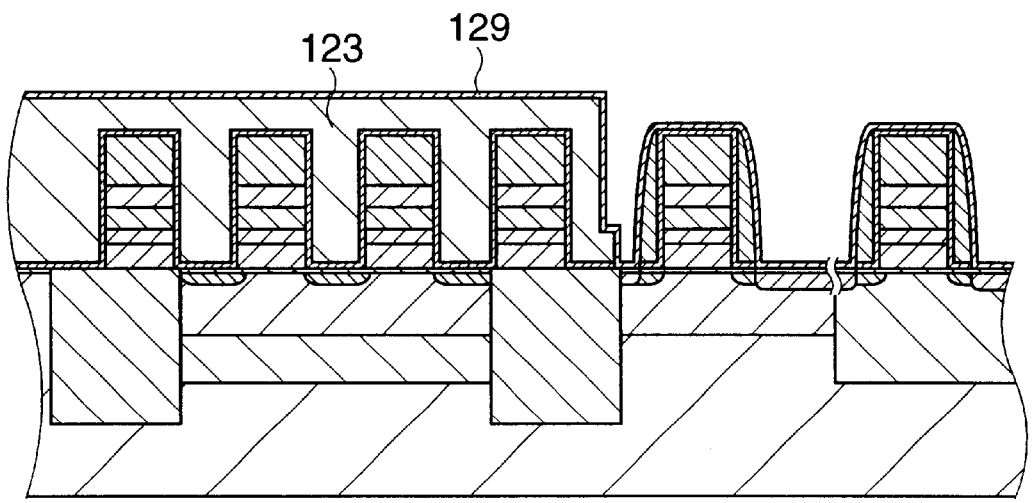
FIGS. 16A and 16B are schematic sectional views showing the third modification to the method of manufacturing the semiconductor device according to the second embodiment.

More specifically, after the steps in FIGS. 7A to 7C, 8A, and 8B, a silicon nitride film 129 having a thickness of about 30 nm is deposited on the entire surface as a passivation film for BLC, as shown in FIG. 16A.

Figure 16B:
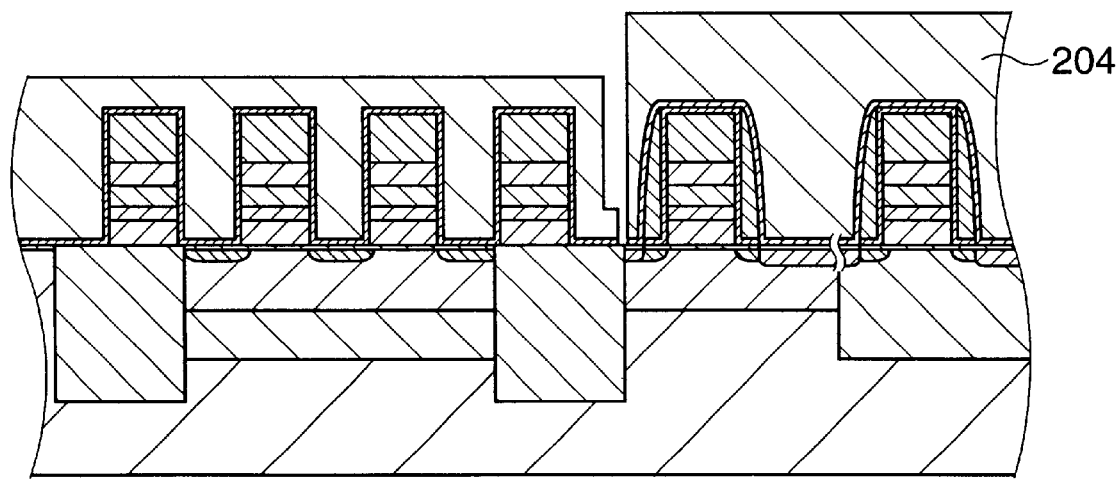

As shown in FIG. 16B, a resist mask 204 is formed to cover the structure on the peripheral circuit region 108 side and isotropically etched using a predetermined wet etchant such as hydrofluoric acid, thereby removing the silicon nitride film 129 covering the structure on the memory cell region 107 side.

Figure 17A:
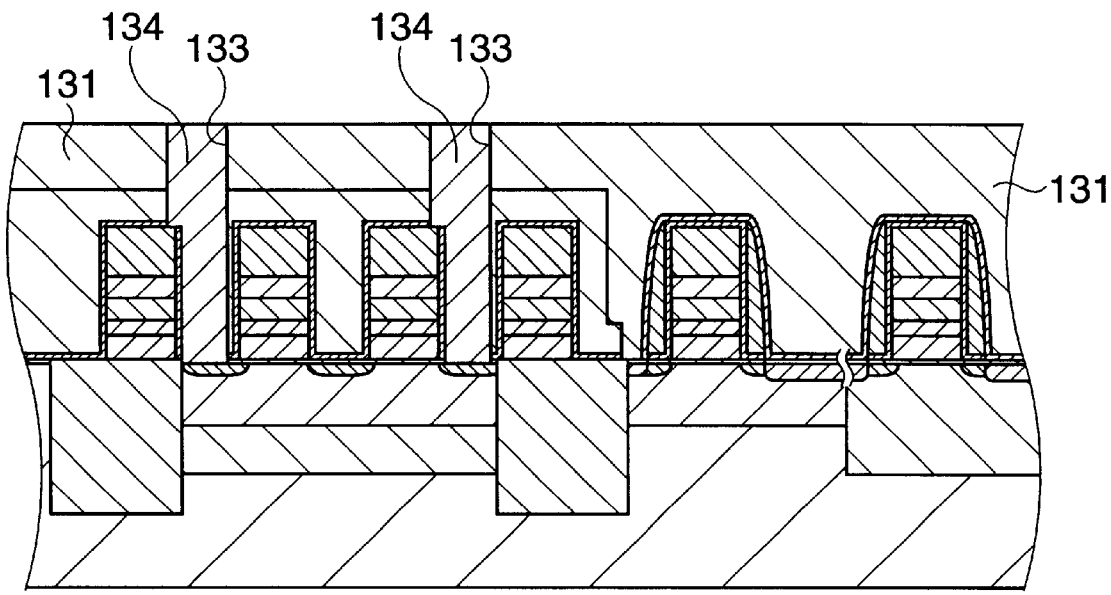
FIGS. 17A and 17B are schematic sectional views showing the third modification to the method of manufacturing the semiconductor device according to the second embodiment.

As shown in FIG. 17A, an insulating interlayer 131 is formed to fill the spaces between gate electrodes 118 and 119. After the surface of the insulating interlayer 131 is planarized, using the photoresist as a mask, the insulating interlayer 131 and the underlying silicon nitride film 122 and the gate insulating film 109 are anisotropically etched using an etching gas having a high selectivity ratio of a nitride film to an oxide film. With this process, contact holes 133 are formed in the memory cell region 107 to expose the surfaces of an LDD diffusion layers 121 functioning as a source and drain.

Next, DASI is deposited to a thickness of about 150 nm such that the contact holes 133 are sufficiently filled, and polished by CMP until the surface of the insulating interlayer 131 is exposed, thereby forming contact plugs 134 that fill the contact holes 133 with DASI.

Figure 17B:
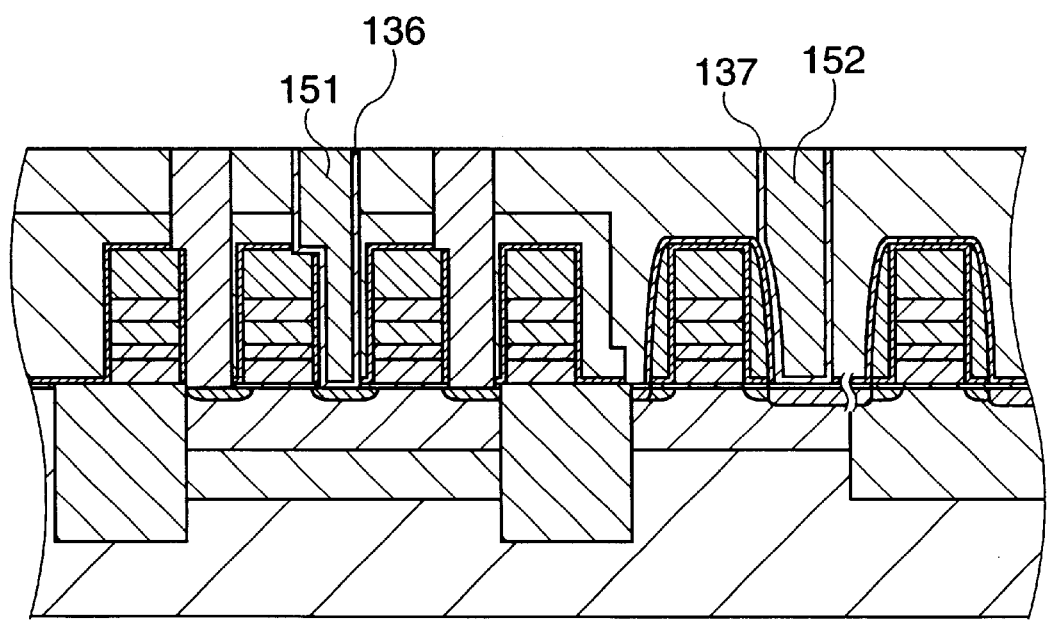

As shown in FIG. 17B, using a photoresist as a mask, the insulating interlayer 131 and the underlying silicon nitride film 122 and the gate insulating film 109 are anisotropically etched using an etching gas having a high selectivity ratio of a nitride film to an oxide film. With this process, a contact hole (bit contact hole) 136 is formed in the memory cell region 107 to expose the surface of the LDD diffusion layer 121 functioning as source/drain, and a contact hole (source/drain contact hole) 137 is formed in the peripheral circuit region 108 to expose the surface of a metal silicide 128.

Next, a barrier metal film 138 having a thickness of about 30 nm is formed to cover the inner surfaces of the contact holes 136 and 137. A metal film is formed to fill the contact holes 136 and 137 sufficiently and then polished by CMP until the surface of the insulating interlayer 131 is exposed, thereby forming contact plugs 151 and 152 that fill the contact holes 136 and 137 with the metal film, respectively.

After that, the steps in FIGS. 11A to 13 are executed to complete a DRAM.

According to the third modification, in addition to the effects described in the second embodiment, the silicon nitride film 129 on the memory cell region 107 side is removed in forming the contact holes 133. For this reason, the contact holes 133 can be simultaneously formed by anisotropic etching in one step, and the contact holes 136 and 137 can also be formed by anisotropic etching in one step. This shortens the process time and simplifies the process.

(Third Embodiment)

The third embodiment of the present invention exemplifies the same semiconductor device and manufacturing method thereof as in the first embodiment. However, the third embodiment is slightly different from the first embodiment in the structure and manufacturing process. For the descriptive convenience, the same reference numerals as in the first embodiment denote the same members in the third embodiment.

FIGS. 18A to 20B are schematic sectional views showing the method of manufacturing the semiconductor device according to the third embodiment.

Figure 18A:
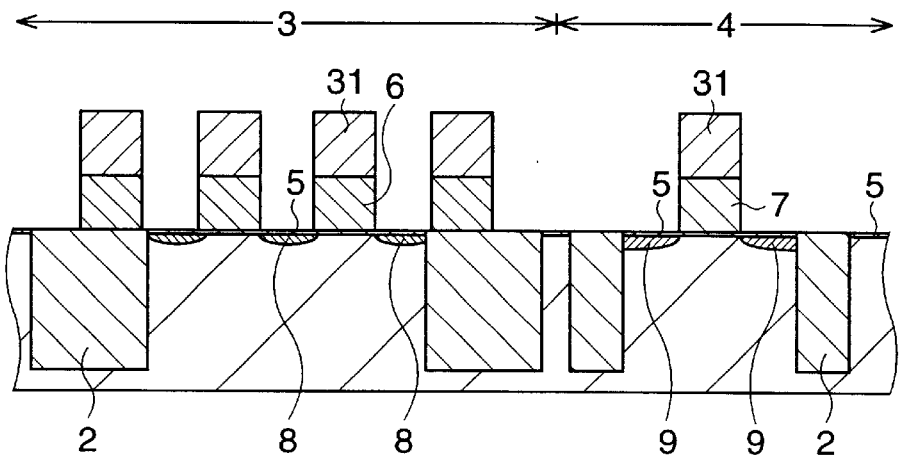
FIGS. 18A to 18C are schematic sectional views showing a method of manufacturing a semiconductor device according to the third embodiment of the present invention.

First, as shown in FIG. 18A, the element isolation region of, e.g., a p-type semiconductor substrate 1 is anisotropically etched to form a trench. The trench is filled with a silicon oxide film to form an element isolation structure 2. After a gate insulating film 5 is formed in first regions 3 and 4 defined by the element isolation structure 2, gate electrodes 6 and 7 on the gate insulating film 5 and an SAC thick silicon nitride film 31 on the gate electrodes are formed by patterning.

Ions are implanted into the semiconductor substrate 1 using the gate electrodes 6 and 7 as a mask to form LDD diffusion layers 8 and 9 (first impurity diffusion layers). In the first region 3, a transistor having the gate electrode 6 and the LDD diffusion layers 8 functioning as a source and a drain is formed.

Figure 18B:
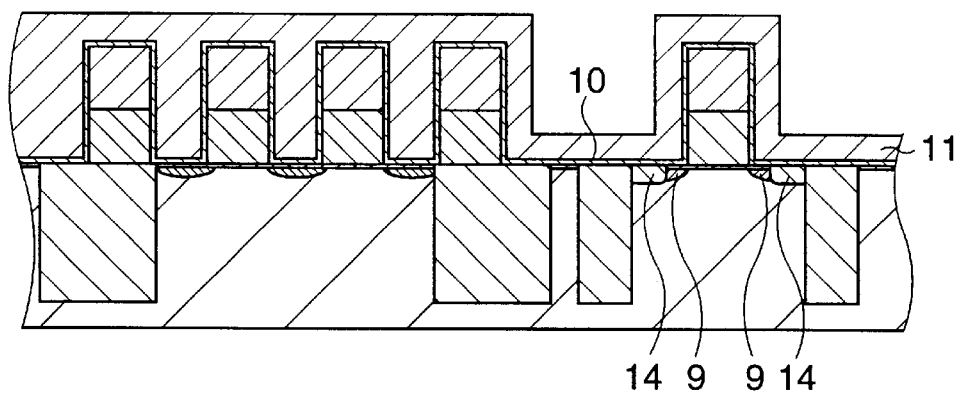

As shown in FIG. 18B, a silicon nitride film 10 having a thickness of about 30 nm is deposited on the entire surface as an SAC passivation film (first passivation film) not to fill the space between the gate electrodes 6 in the first region 3.

Next, a silicon oxide film 11 having a thickness of about 50 nm is deposited as a prospective side wall to fill the space between the gate electrodes 6. With this film thickness, the space between the adjacent gate electrodes 6 in the first region 3 is filled with the silicon oxide film 11, as shown in FIG. 18B, when the distance between the gate electrodes 6 is 150 nm or less.

Figure 18C:
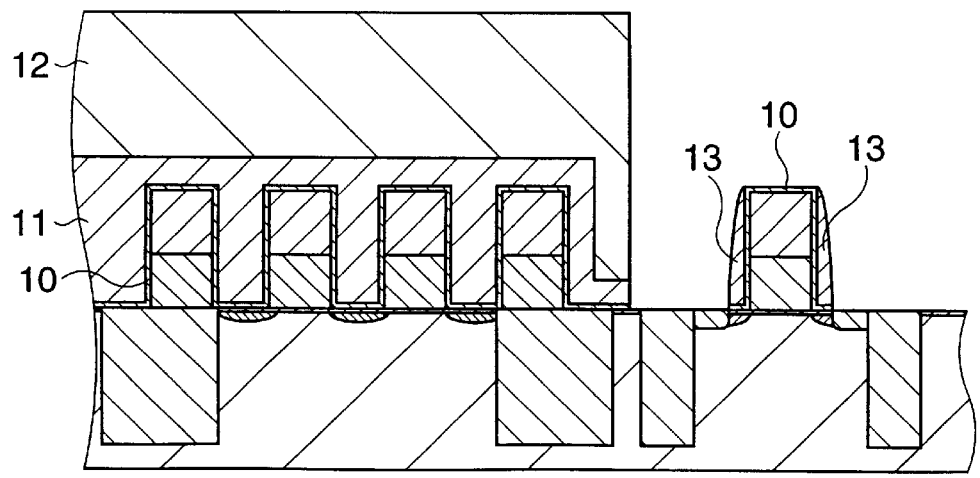

As shown in FIG. 18C, a resist mask 12 is formed to cover only the first region 3. The silicon oxide film 11 and the silicon nitride film 10 are anisotropically etched in their entire surfaces until the LDD diffusion layers 9 in the second region 4 are exposed. With this process, the LDD diffusion layers 9 are exposed, and a side wall 13 made of the silicon oxide film 11 is formed on the side surface of the gate electrode 7.

Ions are implanted into the substrate, partially inclusive the LDD diffusion layers 9, using the gate electrode 7 and the side wall 13 as a mask, thereby forming source/drain 14 (first and second impurity diffusion layers) including the LDD diffusion layers 9. In the second region 4, a transistor Tr2 having the gate electrode 7 and the source/drain 14 with an LDD structure is formed. The mask used for ion implantation is preferably commonly used to form the side wall 13. When one mask is commonly used for ion implantation and formation of the side wall 13, the number of masks and the number of steps can be decreased to enable efficient manufacture of semiconductor devices.

Figure 19A:
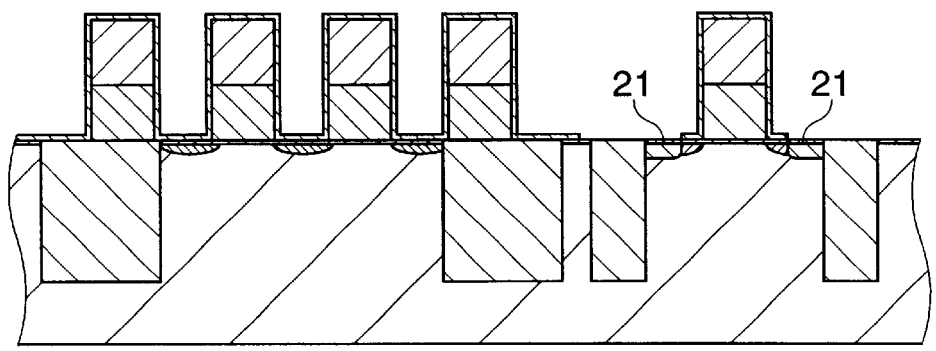
FIGS. 19A to 19C are schematic sectional views showing the method of manufacturing the semiconductor device according to the third embodiment.

Subsequently, as shown in FIG. 19A, the resist mask 12 is removed by ashing. After this, the silicon oxide film 11 in the first region 3 and the side wall 13 in the second region 4 are removed using, e.g., a diluted HF solution. CoSi as a metal silicide 21 is selectively grown on the surfaces of the source/drain 14 to a thickness of about 10 nm by a known silicide process.

Figure 19B:
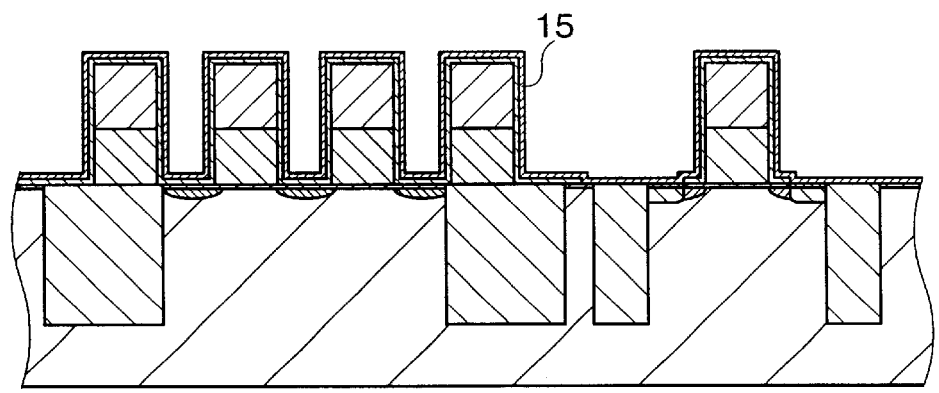

As shown in FIG. 19B, as a passivation film (second passivation film) for BLC, a silicon nitride film 15 having a thickness of about 30 nm is deposited on the entire surface by CVD such that the space between the gate electrodes 6 in the first region 3 is not filled with the total thickness of the silicon nitride films 10 and 15.

A silicon oxide film having a thickness of about 600 nm is deposited by CVD to form an insulating interlayer 16 filling the spaces between the gate electrodes 6 and 7. The insulating interlayer 16 is polished by about 400 nm by CMP (Chemical Mechanical Polishing) to planarize the surface.

Figure 20A:
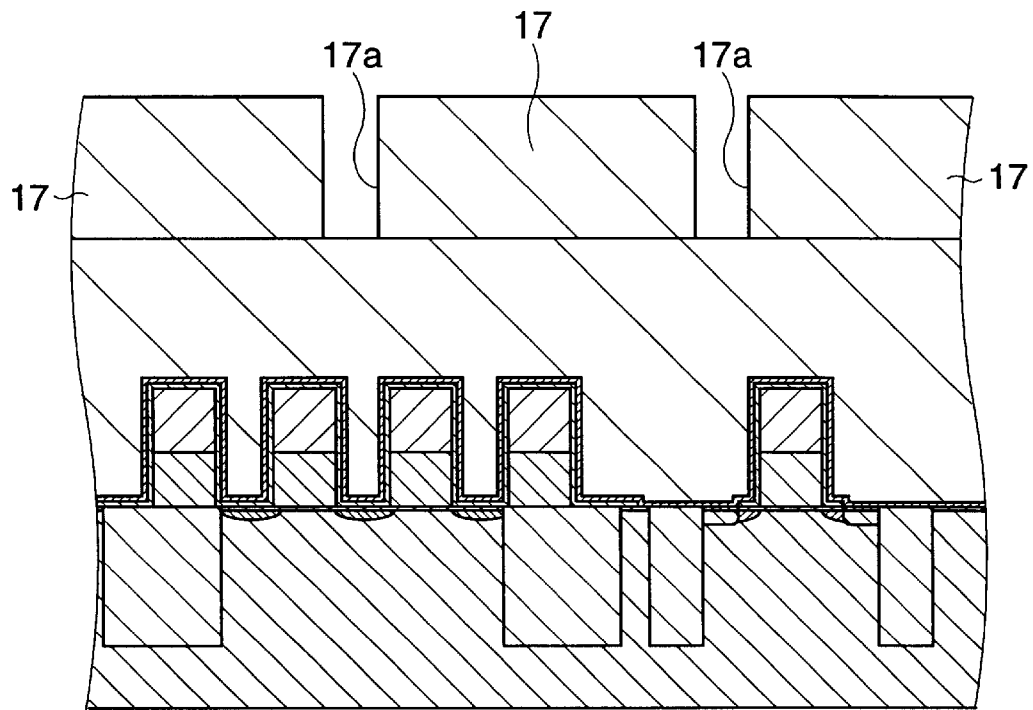
FIGS. 20A and 20B are schematic sectional views showing the method of manufacturing the semiconductor device according to the third embodiment.

As shown in FIG. 20A, a photoresist 17 is applied to the entire surface of the insulating interlayer 16. Openings 17a are formed in the photoresist 17 by photolithography.

Using the photoresist 17 as a mask, the insulating interlayer 16 and the gate insulating film 5 are anisotropically dry-etched.

Even when the interval between the gate electrodes 6 in the first region 3 is small or the contact region of the gate electrode 7 in the second region 4 is small, the gate electrodes 6 and 7 are protected from etching by the silicon nitride films 10, 15, and 31. With this process, contact holes 18 and 19 are formed to expose the surface of the LDD diffusion layer 8 functioning as source/drain in the first region 3 and the surface of the metal silicide 21 in the second region 4, respectively.

More specifically, in forming the contact hole 18, when viewed from the upper side, the silicon nitride film 10 covering the gate electrode 6 is substantially thicker than the silicon nitride film 10 covering the LDD diffusion layer 8. For this reason, the silicon nitride film 10 covering the LDD diffusion layer 8 is etched and removed before the silicon nitride film 10 covering the gate electrode 6 is etched. For the contact hole 19 as well, when viewed from the upper side, the silicon nitride film 15 covering the gate electrode 7 is substantially thicker than the silicon nitride film 15 covering the metal silicide 21. For this reason, the silicon nitride film 15 covering the metal silicide 21 is etched and removed before the silicon nitride film 15 covering the gate electrode 7 is etched.

Figure 20B:
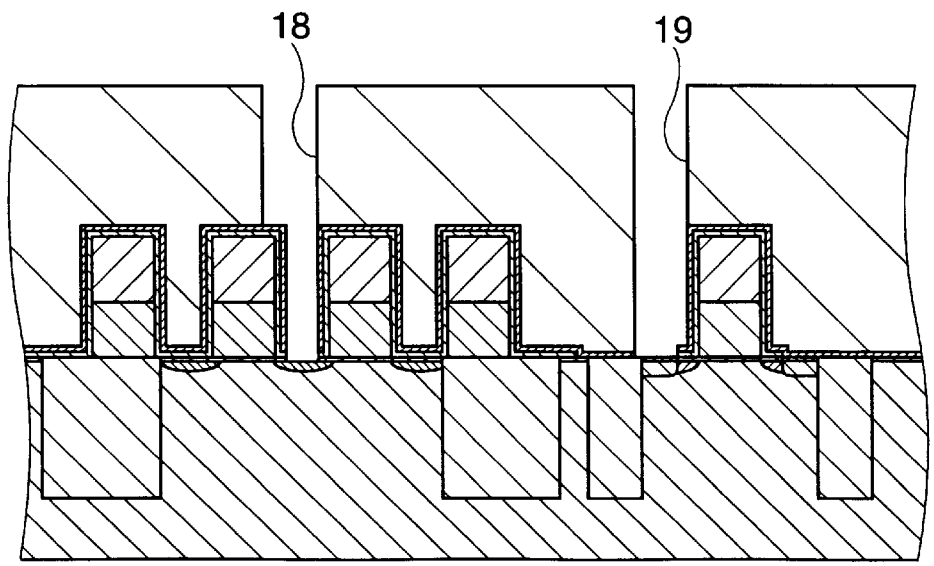

As shown in FIG. 20B, the photoresist 17 is removed by ashing.

After that, an interconnection layer filing the contact holes 18 and 19 and extending on the insulating interlayer 16, and a passivation film covering the entire surface are formed, thereby completing a semiconductor device.

As described above, according to the method of manufacturing the semiconductor device of the third embodiment, silicidation of the source and the drain of the transistor in the second region 4 and the self-alignment technique such as BLC or SAC can be simultaneously used to enable an increase in the degree of integration and improvement of performance (improvement of operation speed) of the semiconductor device having the metal silicide 21 on the transistor in the second region 4.

In addition, since the side wall 13 having a sufficient thickness can be formed for the transistor in the second region 4, a transistor with stable characteristics can be constructed. Furthermore, when the insulting film 11 in the first region 3 and the side wall 13 in the second region 4 are removed before the silicon nitride film 15 as the second passivation film is formed, the silicon nitride films 10 and 15 as the first and second passivation films are formed on the side surfaces of the gate electrodes 6 and 7 in the first and second regions 3 and 4. For this reason, not only the silicon nitride film 10 for SAC but also the silicon nitride film 15 for BLC can be used as a passivation film for SAC. Hence, the breakdown voltage of the contact holes (connection holes) 18 and 19 formed in the first and second regions 3 and 4 can be further improved.

This technique is particularly preferable in a semiconductor memory having a memory cell region as the first region 3 and a peripheral circuit region (logic circuit region) as the second region 4.

Modification

A modification to the third embodiment will be described below. The same reference numerals as in the semiconductor device of the third embodiment denote the same members in this modification, and a detailed description thereof will be omitted.

In this modification, in forming n- and p-type transistors in a second region 4, side walls 13 and sources and drains 14 are continuously formed.

Figure 21A:
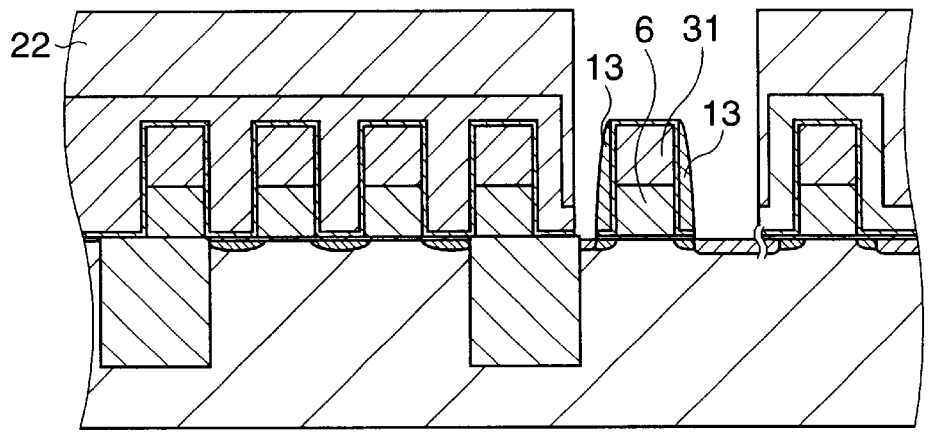
FIGS. 21A to 21C are schematic sectional views showing the method of manufacturing the semiconductor device according to the third embodiment.

More specifically, after the steps shown in FIGS. 18A and 18B, a resist mask 22 is formed, which has an opening corresponding to only a gate electrode 7 as a prospective n-type transistor in the second region 4, as shown in FIG. 21A. After a side wall 13 is formed according to the same procedure as in FIG. 18C, n-type impurities are ion-implanted to form n-type source/drain 14.

Figure 21B:
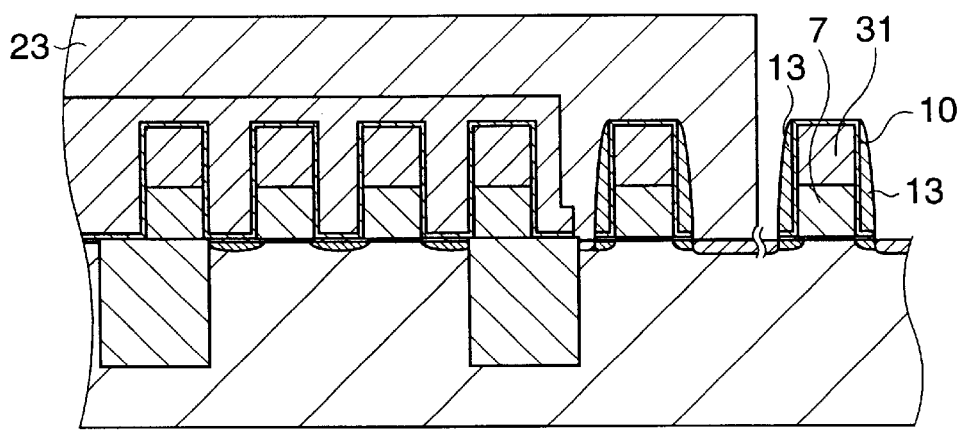

Next, as shown in FIG. 21B, after the resist mask 22 is removed by ashing, a resist mask 23 is formed, which has an opening corresponding to only the gate electrode 7 as a prospective p-type transistor in the second region 4. A side wall 13 is formed in a similar way, and then p-type impurities are ion-implanted to form p-type source/drain 14. The process (side wall formation and ion implantation) for the n-type transistor and that for the p-type transistor may be performed in a reversed order.

Figure 21C:
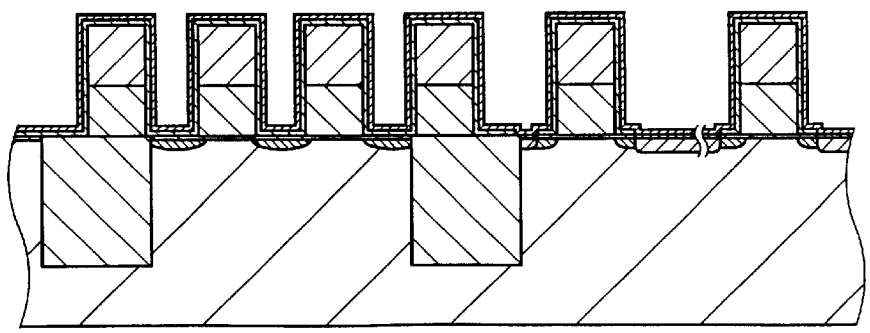

After the resist mask 23 is removed by ashing, as shown in FIG. 21C, CoSi as a metal silicide 21 is selectively grown on the surfaces of the source/drain 14 to a thickness of about 10 nm by a known silicide process, as in FIGS. 19A and 19B.

Figure 19C:
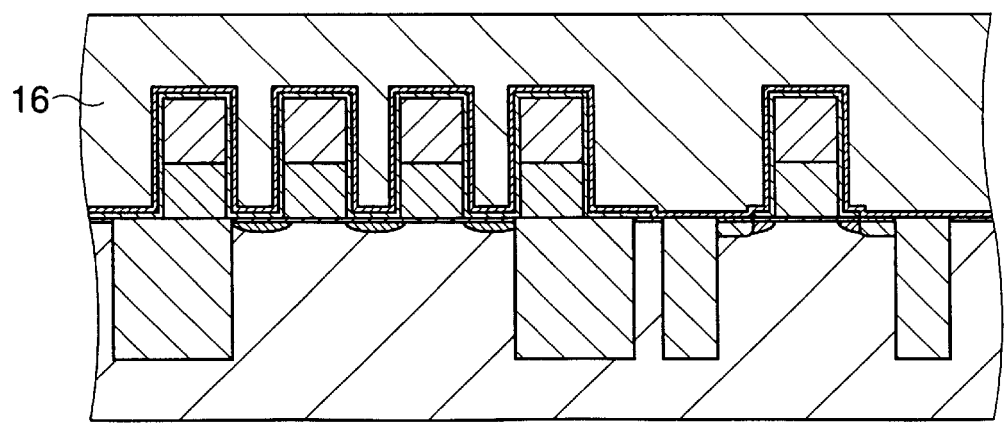

After this, the steps in FIGS. 19C, 20A, and 20B are executed to form contact holes 18 and 19.

According to this modification, in addition to the effects described in the third embodiment, when one mask is commonly used for ion implantation and formation of the side wall 13 for each of the transistors of opposite conductivity types, the number of masks and the number of steps can be decreased to enable efficient manufacture of semiconductor devices.

(Fourth Embodiment)

In the fourth embodiment of the present invention, an example in which the third embodiment is applied to a DRAM having a peripheral circuit (logic circuit) region will be described. In this embodiment, for the descriptive convenience, the structure of the DRAM and the manufacturing method thereof will be described together, and the same reference numerals as in the DRAM of the second embodiment denote the same member.

Figure 22:
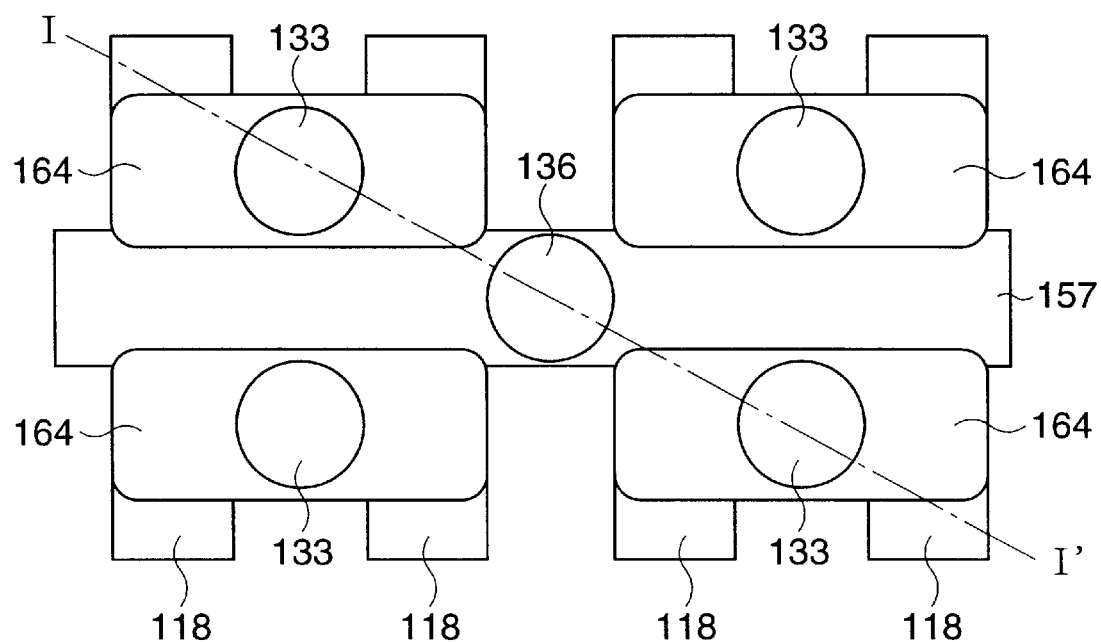
FIG. 22 is a schematic plan view showing a DRAM according to the fourth embodiment of the present invention.

FIG. 22 is a schematic plan view showing the DRAM according to the fourth embodiment. FIGS. 23A to 29 are schematic sectional views (taken along a line I–I' in FIG. 22) showing steps in manufacturing the DRAM according to the fourth embodiment.

Figure 23A:
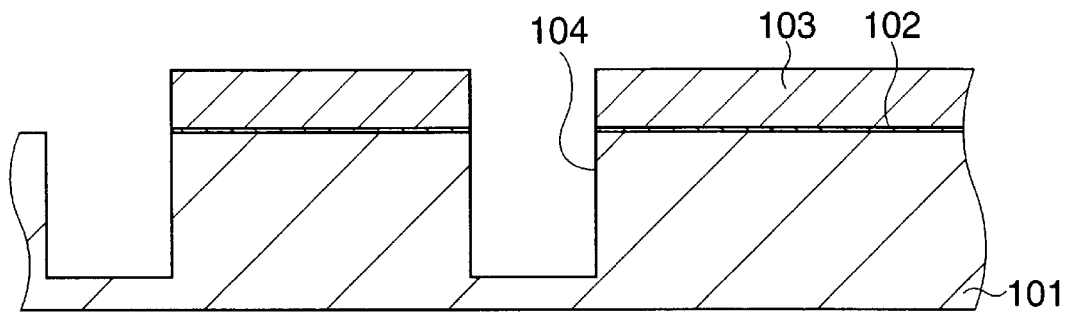
FIGS. 23A to 23C are schematic sectional views showing steps in manufacturing the DRAM according to the fourth embodiment.

First, as shown in FIG. 23A, to define an element active region on the surface of a p-type silicon semiconductor substrate 101, an initial oxide film 102 having a thickness of about 10 nm is formed on the semiconductor substrate 101 by thermal oxidation at about 850° C. Next, a silicon nitride film 103 having a thickness of about 150 nm is deposited by CVD. A resist mask (not shown) having an opening corresponding to the element isolation region is formed. The silicon nitride film 103 and the initial oxide film 102, and then the semiconductor substrate 101 are anisotropically etched by about 300 nm to form a trench 104 in accordance with the element isolation region.

Figure 23B:
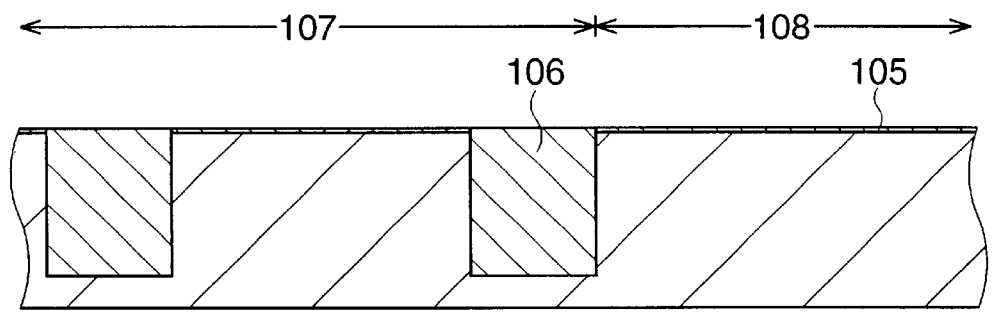

As shown in FIG. 23B, a silicon oxide film having a thickness of about 600 nm is deposited by CVD to fill the trench 104. After this silicon oxide film is polished by about 150 nm by CMP using the silicon nitride film 103 as a stopper, the silicon nitride film 103 is removed. A sacrificial oxide film 105 having a thickness of about 10 nm is formed on the surface of the semiconductor substrate 101 by thermal oxidation at about 850° C., thereby forming a trench-type element isolation structure 106 having the trench 104 filled with the silicon oxide film. At this time, the element isolation structure 106 defines an element active region so a memory cell region 107 as the first region and a peripheral circuit region (logic circuit region) 108 as the second region are formed.

Figure 23C:
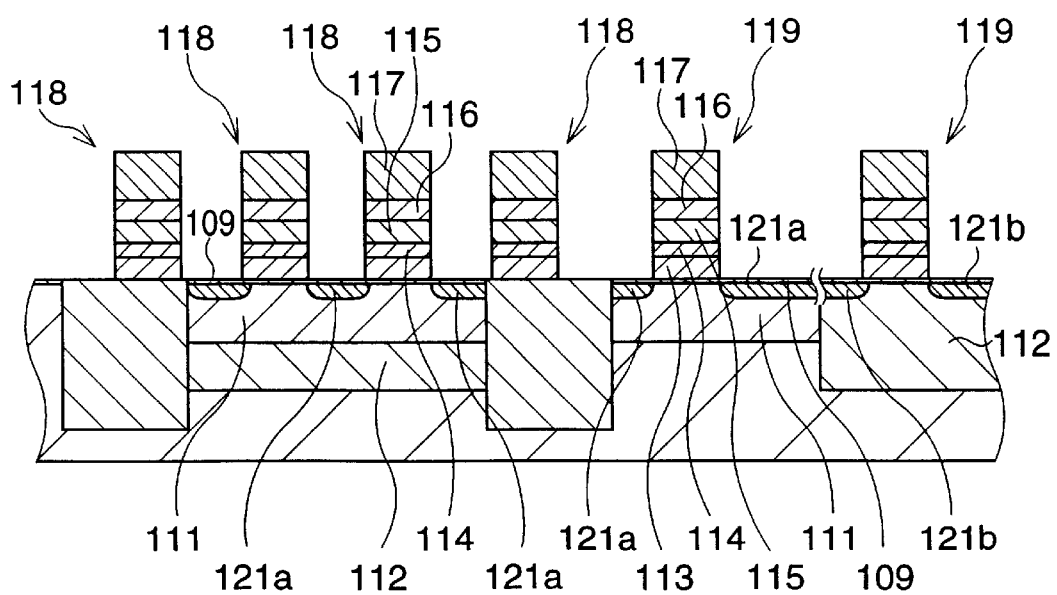

As shown in FIG. 23C, p-type impurities (B: boron) and n-type impurities (P: phosphorus) are ion-implanted into both the memory cell region 107 and the peripheral circuit region 108 through the sacrificial oxide film 105 at acceleration energies of 200 KeV and 800 KeV and doses of $1\times10^{13}/cm^2$ and $1\times10^{13}/cm^2$, respectively, to form a p-well region 111 and an n-well region 112.

Ion implantation for threshold value (Vth) control of transistors is performed next. For example, in the memory cell region 107, boron ions are implanted at an acceleration energy of 20 KeV and a dose of $1\times10^{13}/cm^2$.

After the sacrificial oxide film 105 is removed, a gate insulating film 109 having a thickness of about 10 nm is formed on the surface in the memory cell region 107 and the peripheral circuit region 108 by thermal oxidation at about 850° C.

A 70 nm-thick DASI (Doped Amorphous Silicon) film 113, a 30 nm-thick barrier metal film 114, a 40 nm-thick metal film 115, a 40 nm-thick silicon oxynitride film 116 serving as an anti-reflection film, and a 120 nm-thick SAC silicon nitride film 117 are sequentially formed. These films are subjected to photolithography and subsequent etching to form gate electrodes 118 and 119 by patterning. The gate electrodes 118 are formed in the memory cell region 107, and the gate electrodes 119 are formed in the peripheral circuit region 108. FIG. 23C shows the gate electrodes 118 and 119 across the element isolation structure 106. These gate electrodes are formed from the element active region to the element isolation region and only appear to be formed on the element isolation structure 106 in this sectional view.

Next, ions are implanted into the p-well region 111 and the n-well region 112 to form LDD diffusion layers 121a and 121b (first impurity diffusion layers). In the memory cell region 107, the gate electrodes 118 and the LDD diffusion layers 121a functioning as a source and a drain construct a transistor Tr1.

Figure 24A:
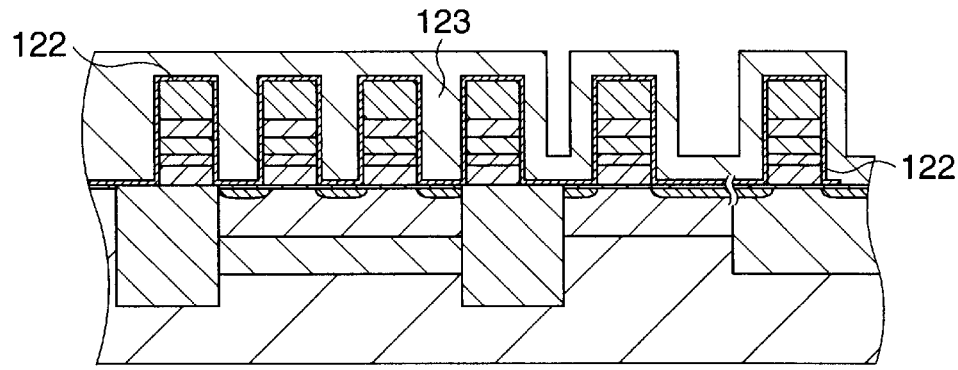
FIGS. 24A to 24C are schematic sectional views showing steps in manufacturing the DRAM according to the fourth embodiment.

As shown in FIG. 24A, after a silicon nitride film 122 having a thickness of about 30 nm is formed on the entire surface by CVD as a SAC passivation film, a silicon oxide film 123 having a thickness of about 50 nm is formed for side wall formation.

Figure 24B:
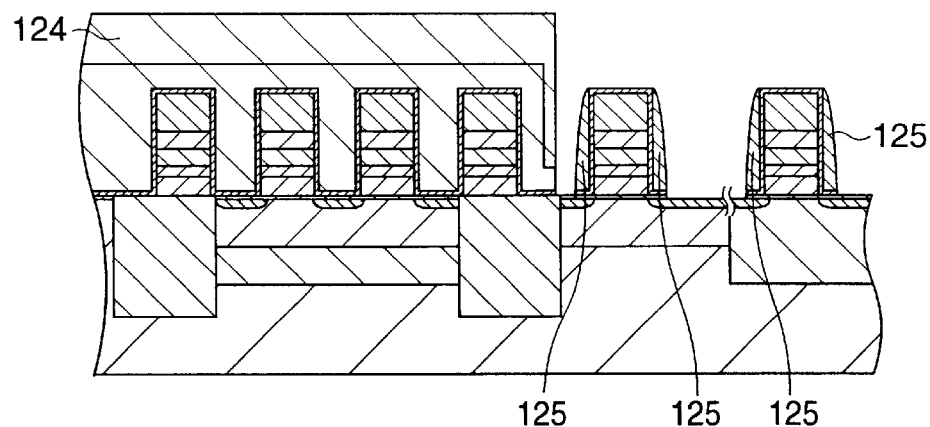

As shown in FIG. 24B, a photoresist is applied, and a resist mask 124 is formed by photolithography to cover the memory cell region 107. The entire surface is anisotropically etched until the surfaces of the LDD diffusion layers 121 in the peripheral circuit region 108 are exposed, thereby forming side walls 125 formed from the silicon oxide film 123 on the side surfaces of the gate electrodes 119 in the peripheral circuit region 108.

Figure 24C:
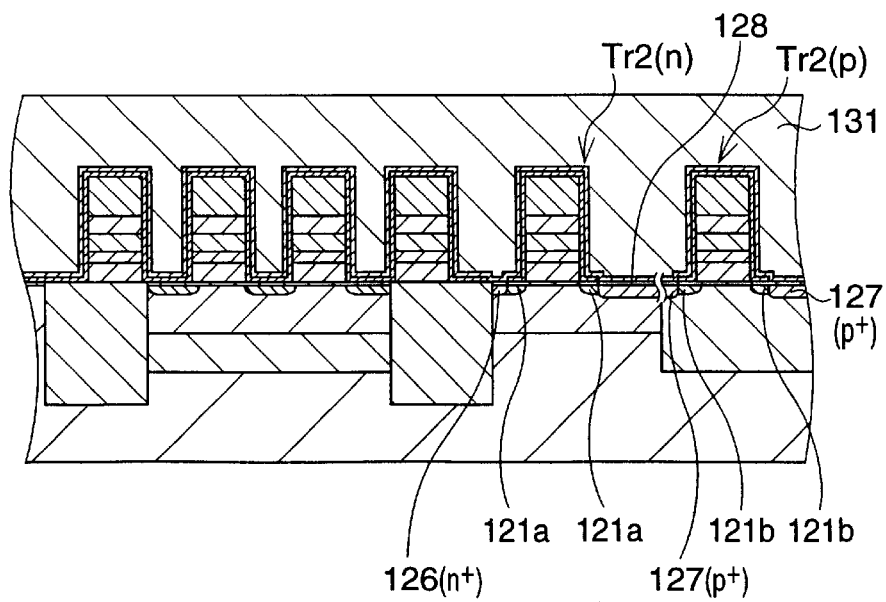

As shown in FIG. 24C, the resist mask 124 is removed by ashing. Impurities of n- and p-types are ion-implanted into the n- and p-channel sides of the peripheral circuit region 108 to form source/drain 126(n$^+$ and source/drain 127(p$^+$) first and second impurity diffusion layers) joined to the LDD diffusion layers 121a and 121b, respectively. In the peripheral circuit region 108, an n-type transistor Tr2(n) comprising the gate electrode 119 and source/drain 126(n$^+$) and a p-type transistor Tr2(p) comprising the gate electrode 119 and source/drain 127(p$^+$) are formed.

The silicon oxide film 123 and the side wall 125 are removed using, e.g., a diluted HF solution. CoSi as a metal silicide 128 is selectively grown on the exposed surfaces of the source/drain 126(n$^+$) and the source/drain 127(p$^+$) in the peripheral circuit region 108 to a thickness of about 10 nm by a known silicide process.

As a BLC passivation film, a silicon nitride film 129 having a thickness of about 30 nm is deposited on the entire surface by CVD such that the space between the gate electrodes 118 in the memory cell region 107 is not filled with the total thickness of the silicon nitride film 129 and the silicon nitride film 122. A silicon oxide film having a thickness of about 600 nm is deposited to form an insulating interlayer 131 filling the spaces between the gate electrodes 118 and 119. The insulating interlayer 131 is polished by about 400 nm by CMP (Chemical Mechanical Polishing) to planarize the surface.

Subsequently, contact holes (storage electrode contact holes) for memory capacitors of the DRAM are formed.

Figure 25A:
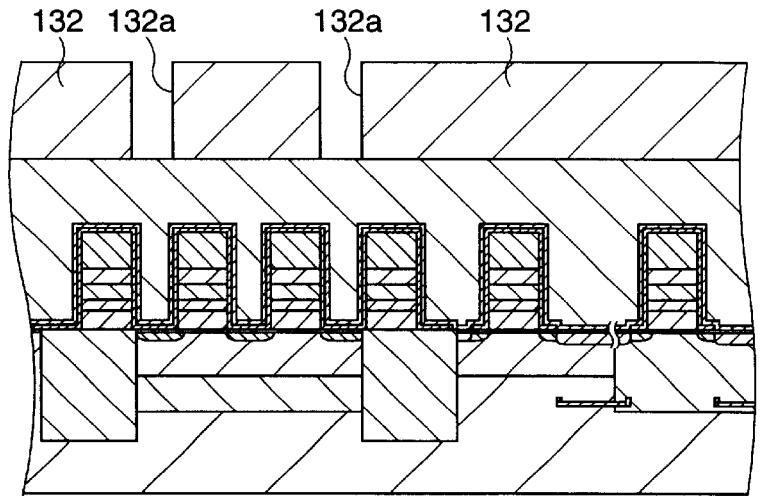
FIGS. 25A to 25C are schematic sectional views showing steps in manufacturing the DRAM according to the fourth embodiment.

As shown in FIG. 25A, a photoresist 132 is applied to the entire surface of the insulating interlayer 131, and openings 132a for drain contact formation are formed in the photoresist 132 by photolithography.

Figure 25B:
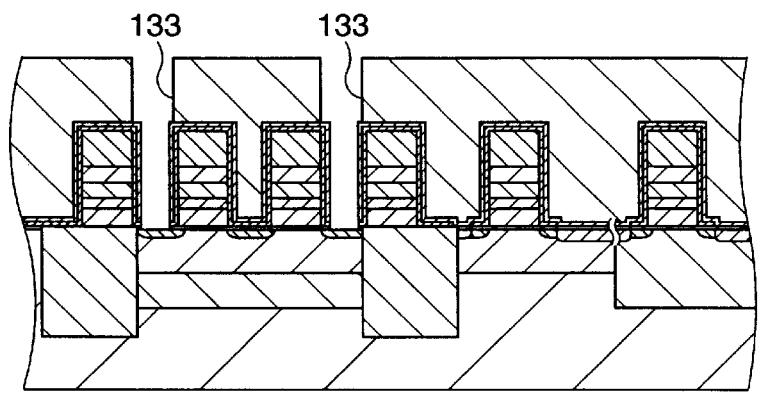

As shown in FIG. 25B, using the photoresist 132 as a mask, the insulating interlayer 131, the silicon nitride film 129, and the gate insulating film 109 in the memory cell region 107 are anisotropically etched. Even when the interval between the gate electrodes 118 in the memory cell region 107 is small, the gate electrodes 118 are protected from etching by the silicon nitride films 122 and 129. With this process, contact holes 133 are formed in the memory cell region 107 to expose the surfaces of the LDD diffusion layers 121a functioning as a source and a drain.

Figure 25C:
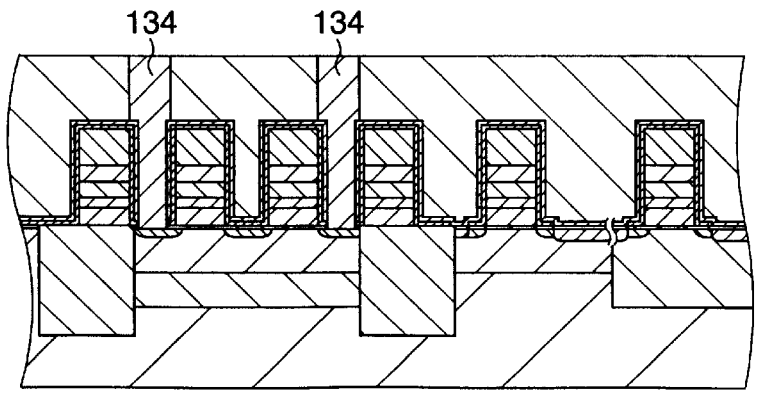

After the photoresist 132 is removed by ashing, DASI is deposited to a thickness of about 150 nm such that the contact holes 133 are sufficiently filled, as shown in FIG. 25C. The DASI film is polished by CMP until the surface of the insulating interlayer 131 is exposed, thereby forming contact plugs 134 that fill the contact holes 133 with DASI.

Subsequently, the bit contact hole of the transistor Tr1 is formed in the memory cell region 107, and the source/drain contact hole of the transistors Tr2(n) and Tr2(p) is formed in the peripheral circuit region 108.

Figure 26A:
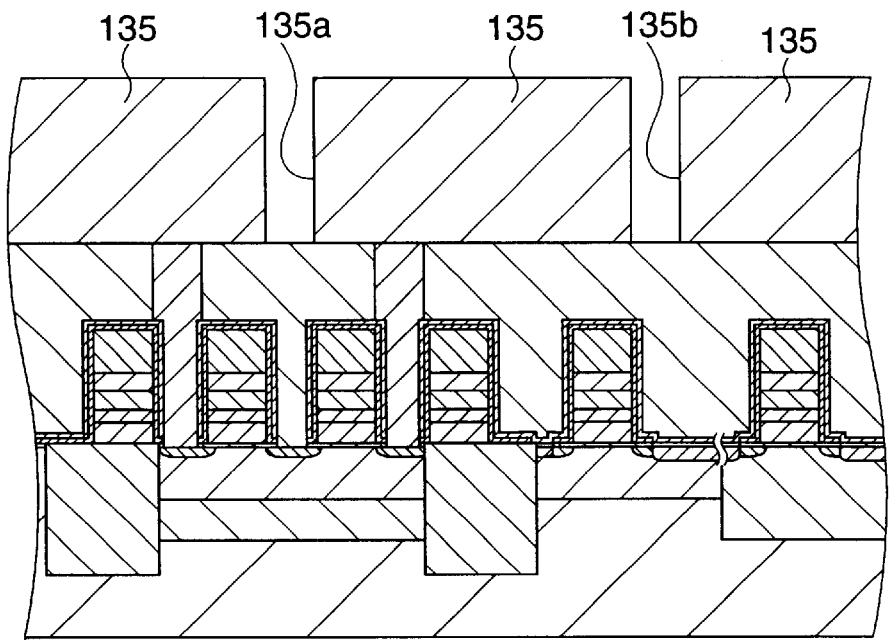
FIGS. 26A and 26B are schematic sectional views showing steps in manufacturing the DRAM according to the fourth embodiment.

As shown in FIG. 26A, a photoresist 135 is applied to the entire surface of the insulating interlayer 131, and an opening 135a for bit contact formation and an opening 135b for source/drain contact formation are formed in the photoresist 135 by photolithography.

Figure 26B:
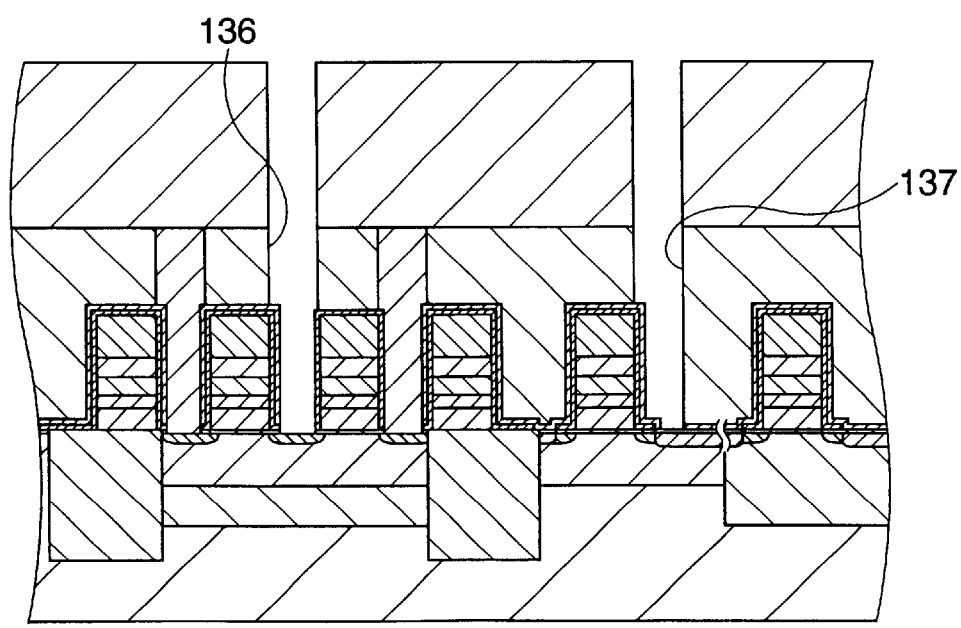

As shown in FIG. 26B, using the photoresist 135 as a mask, the insulating interlayer 131, the silicon nitride films 122 and 129, and the gate insulating film 109 in both the memory cell region 107 and the peripheral circuit region 108 are anisotropically etched. Even when the interval between the gate electrodes 118 in the memory cell region 107 is small or the interval between the gate electrodes 119 in the peripheral circuit region 108 is small, the gate electrodes 118 and 119 are protected from etching by the silicon nitride films 122 and 129. With this process, a contact hole (bit contact hole) 136 is formed in the memory cell region 107 to expose the surface of the LDD diffusion layer 121 functioning as source/drain, and a contact hole (source/drain contact hole) 137 is formed in the peripheral circuit region 108 to expose the surface of the metal silicide 128.

Figure 27A:
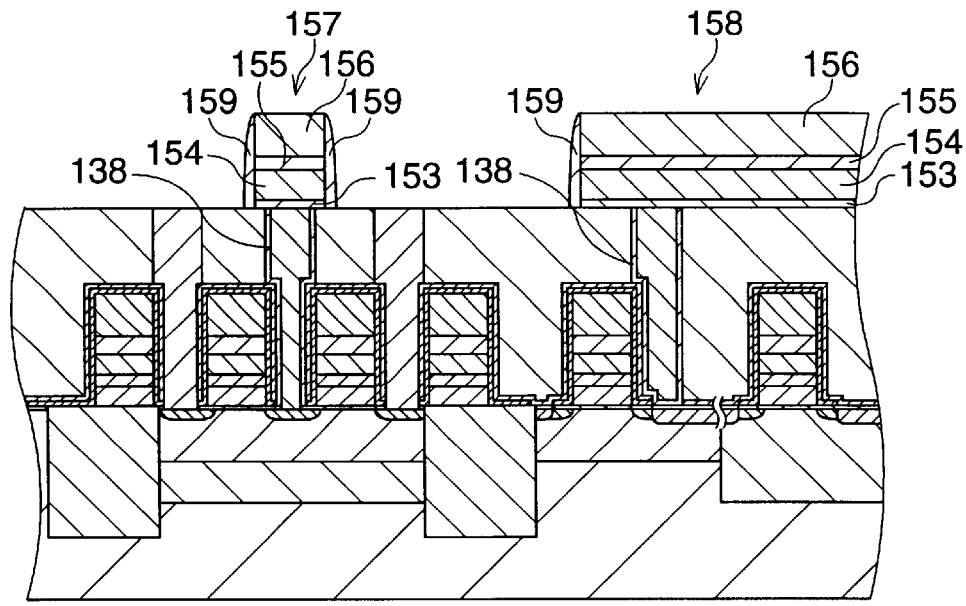
FIGS. 27A and 27B are schematic sectional views showing steps in manufacturing the DRAM according to the fourth embodiment.

After the photoresist 135 is removed by ashing, a barrier metal film 138 having a thickness of about 30 nm is formed to cover the inner surfaces of the contact holes 136 and 137, as shown in FIG. 27A. A metal film is formed to sufficiently fill the contact holes 136 and 137 and then polished by CMP until the surface of the insulating interlayer 131 is exposed, thereby forming contact plugs 151 and 152 that fill the contact holes 136 and 137 with the metal film, respectively.

Next, a 30 nm-thick barrier metal film 153, a 80 nm-thick metal film 154, a 50 nm-thick silicon oxynitride film 155 and serving as an anti-reflection film, and a 130 nm-thick silicon nitride film 156 are sequentially formed on the insulating interlayer 131. These films are patterned by photolithography and subsequent etching to form a bit line 157 connected to the contact plug 151 and an interconnection layer 158 connected to the contact plug 152.

A silicon nitride film having a thickness of about 30 nm is deposited on the entire surface. After that, the entire surface is anisotropically etched to form a side wall 159 on the side surface of each of the bit line 157 and interconnection layer 158.

Figure 27B:
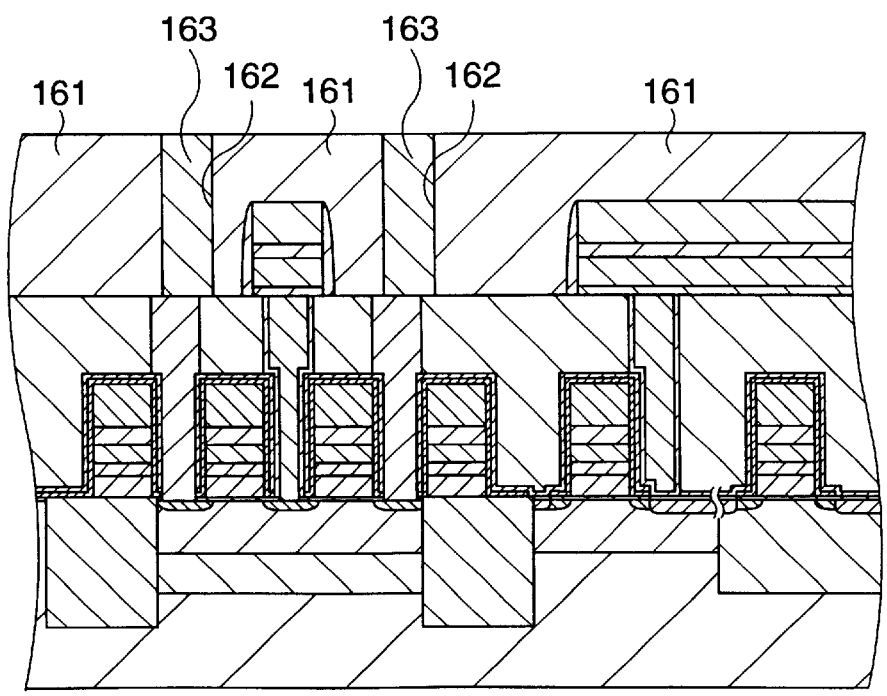

A memory capacitor 171 connected to the LDD diffusion layer 121 of a transistor 141 in the memory cell region 107 through the contact plug 134 is formed next. As shown in FIG. 27B, a silicon oxide film having a thickness of about 600 nm is deposited to bury the bit line 157 and the interconnection layer 158 to form an insulating interlayer 161. The surface is polished and planarized by CMP.

To connect the contact plugs 134, openings are formed in the insulating interlayer 161 by photolithography and subsequent etching to form contact holes 162.

DASI is deposited to a thickness of about 150 nm to fill the contact holes 162 sufficiently and polished by CMP until the surface of the insulating interlayer 161 is exposed, thereby forming contact plugs 163 that fill the contact holes 162 with DASI and are connected to the contact plugs 134.

Figure 28:
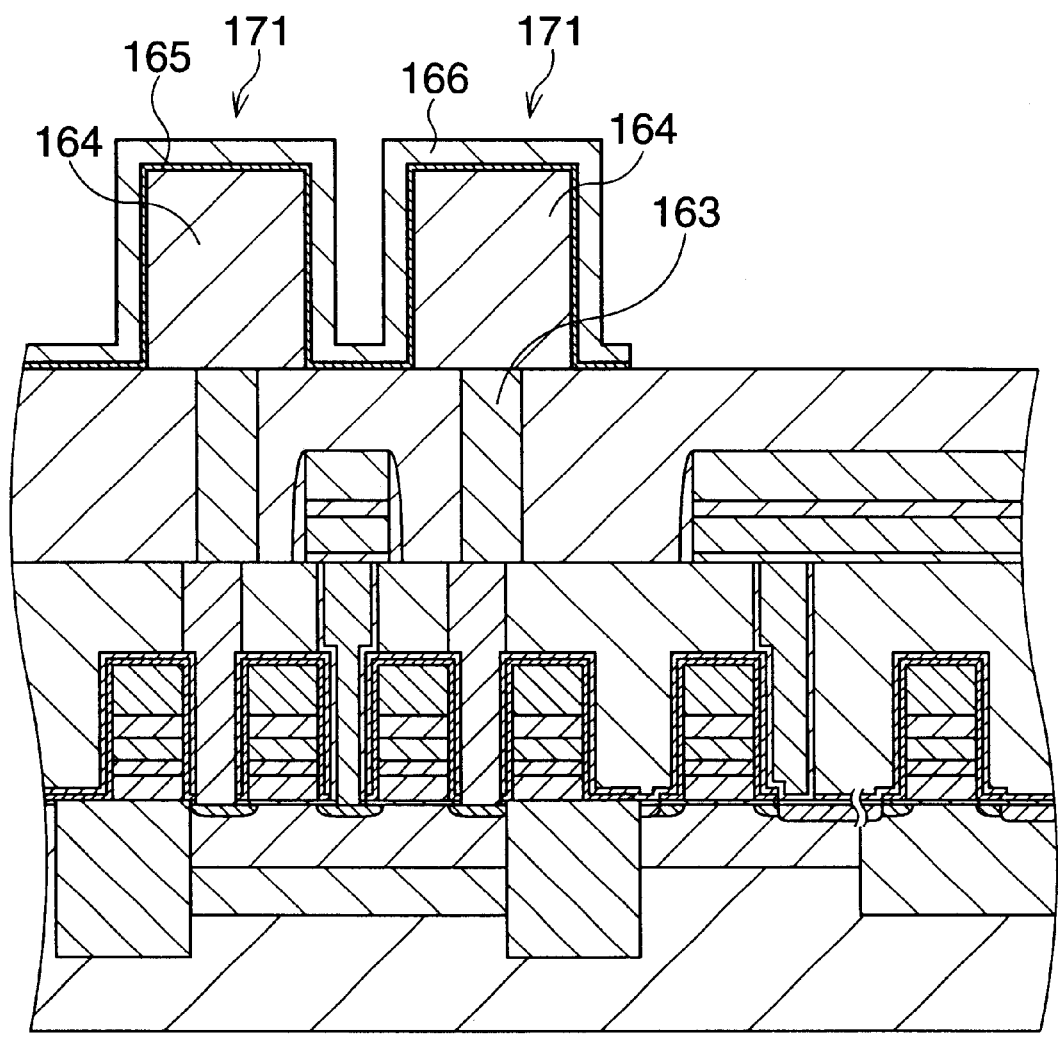
FIG. 28 is a schematic sectional view showing a step in manufacturing the DRAM according to the fourth embodiment.

As shown in FIG. 28, DASI is deposited on the insulating interlayer 161 to a thickness of about 700 nm and patterned by photolithography and subsequent etching to form storage node electrodes 164 connected to the contact plugs 163.

TaO, SiN, or SiON is deposited to a thickness of about 5 nm by CVD to form a dielectric film 165 that covers the storage node electrodes 164. After that, DASI is deposited to a thickness of about 100 nm. The DASI and underlying dielectric film 165 are patterned by photolithography and subsequent etching to form cell plate electrodes 166. The memory capacitors 171 in which the storage node electrode 164 and the cell plate electrode 166 are capacitively coupled through the dielectric film 165 are completed.

An upper interconnection layer 181 is formed by patterning.

Figure 29:
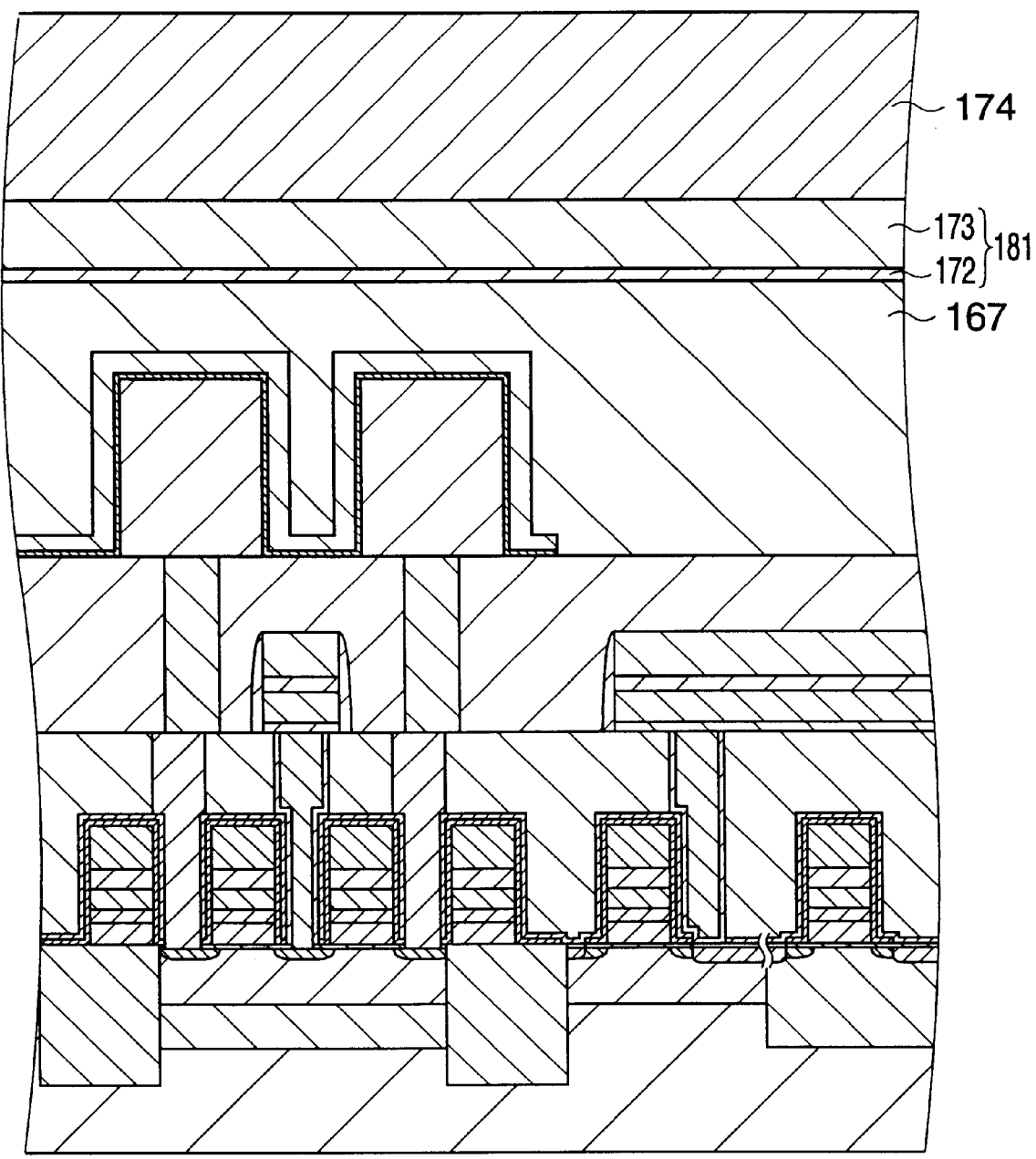
FIG. 29 is a schematic sectional view showing a step in manufacturing the DRAM according to the fourth embodiment.

As shown in FIG. 29, a silicon oxide film having a thickness of about 1,000 nm is deposited to form an insulating interlayer 167 which buries the memory capacitors 171. The surface is polished and planarized by CMP.

Contact holes connected to the bit lines 157 and 158 shown in FIG. 28 are formed in the insulating interlayers 167 and 161, and a metal film (metal film, contact holes, and barrier metal film are not shown) that fills the contact holes through a barrier metal, as in the contact plugs 151 and 152, are formed.

A barrier metal film 172 having a thickness of about 30 nm and a metal film 173 having a thickness of about 400 nm are sequentially formed and patterned by photolithography and subsequent etching to form the upper interconnection layer 181. After that, a passivation film 174 is formed to cover the entire surface, thus completing a DRAM.

The present invention is not limited to the above embodiment. For example, although the upper interconnection layer 181 is formed from a single layer, an interconnection layer having a multilayered structure having two or more layers may be formed. The present invention can apply not only to a DRAM but also a nonvolatile semiconductor memory such as a flash memory.

As described above, according to the DRAM manufacturing method of this embodiment, silicidation of the sources and the drains of the transistors Tr2(n) and Tr2(p) in the peripheral circuit region 108 and the self-alignment technique such as BLC or SAC can be simultaneously used to enable an increase in the degree of integration and improvement of performance (improvement of operation speed) of the DRAM having the metal silicide 21 on the transistors Tr2(n) and Tr2(p) in peripheral circuit region 108.

In addition, since a side wall 125 having a sufficient thickness can be formed for the transistor in the peripheral circuit region 108, a transistor with stable characteristics can be constructed. Furthermore, when the insulting film 121 in the memory cell region 107 and the side wall 125 in the peripheral circuit region 108 are removed before the silicon nitride film 129 as the second passivation film is formed, the silicon nitride films 122 and 129 as the first and second passivation films are formed on the side surfaces of the gate electrodes 118 and 119 in the memory cell region 107 and the peripheral circuit region 108. For this reason, not only the silicon nitride film 122 for SAC but also the silicon nitride film 129 for BLC can be used as an SAC passivation film. Hence, the breakdown voltage of the contact holes (connection holes) 133, 136, and 137 formed in the memory cell region 107 and the peripheral circuit region 108 can be further improved.

Modification

A modification to the fourth embodiment will be described below. The same reference numerals as in the semiconductor device of the fourth embodiment denote the same members in this modification, and a detailed description thereof will be omitted.

In this modification, in forming n- and p-type transistors Tr2(n) and Tr2(p) in a peripheral circuit region 108, side walls 125 and source/drain 126($n^+$) and source/drain 127($p^+$) are continuously formed.

Figure 30A:
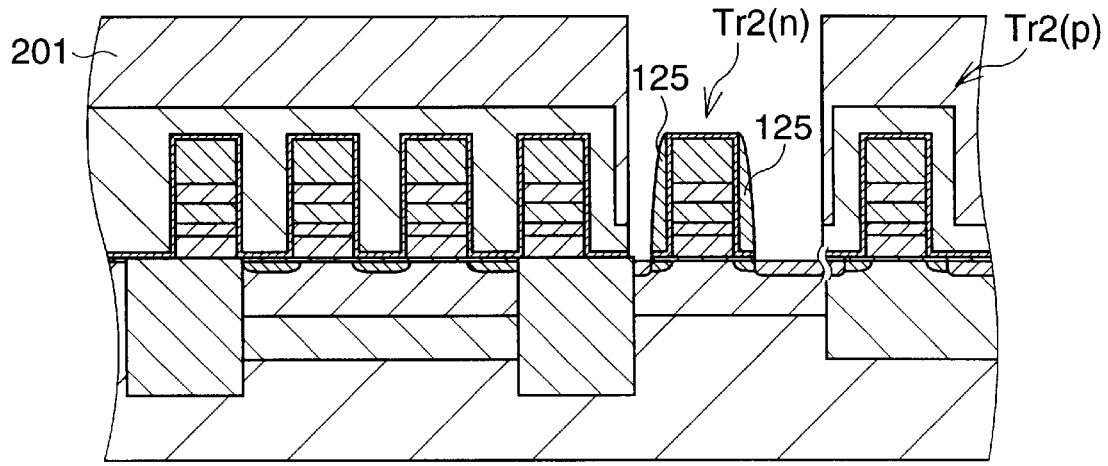
FIGS. 30A and 30B are schematic sectional views showing a modification to the method of manufacturing the semiconductor device according to the fourth embodiment.

More specifically, after the steps shown in FIGS. 23A to 23C and 24A, a resist mask 201 is formed, which has an opening corresponding to only a gate electrode 119 as a prospective n-type transistor Tr2(n) in the peripheral circuit region 108, as shown in FIG. 30A. After a side wall 125 is formed according to the same procedure as in FIG. 24B, n-type impurities are ion-implanted to form n-type source/drain 126($n^+$).

Figure 30B:
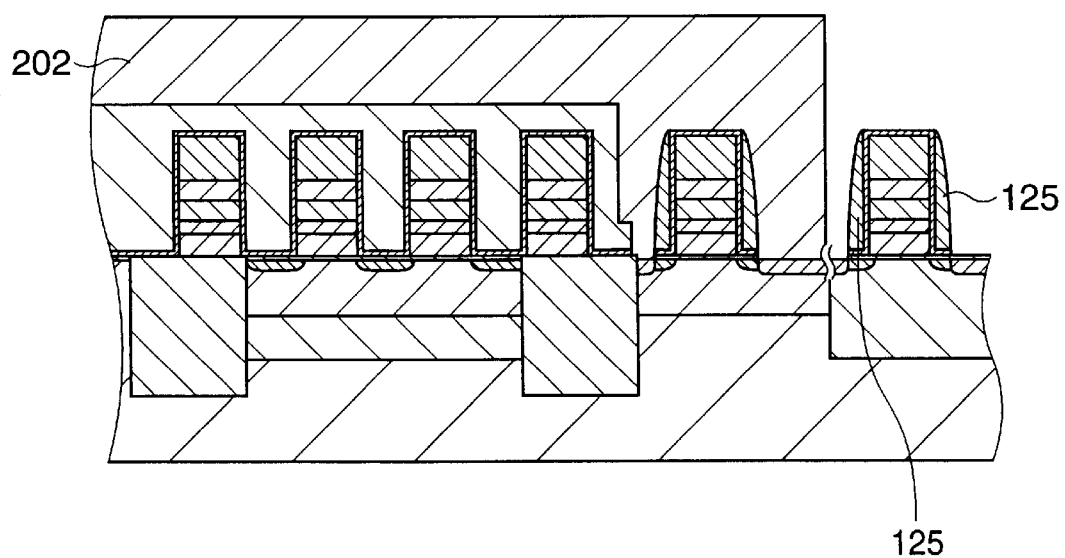

Next, as shown in FIG. 30B, after the resist mask 201 is removed by ashing, a resist mask 202 is formed, which has an opening corresponding to only a gate electrode 119 as a prospective p-type transistor Tr2($p^+$) in the peripheral circuit region 108. A side wall 125 is formed in a similar way, and then p-type impurities are ion-implanted to form p-type source/drain 127($p^+$). The process (side wall formation and ion implantation) for the n-type transistor and that for the p-type transistor may be performed in a reversed order.

After a resist mask 202 is removed by ashing, CoSi as a metal silicide 128 is selectively grown on the surfaces of the source/drain 126($n^+$) and the source/drain 127($p^+$) to a thickness of about 10 nm by a known silicide process, as in FIG. 24C. After that, an insulating interlayer 131 is formed, and its surface is planarized.

After this, the steps in FIGS. 25A to 29 are executed to complete a DRAM.

According to this modification, in addition to the effects described in the fourth embodiment, when one mask is commonly used for ion implantation and formation of the side wall 125 for each of the transistors Tr2(n) and Tr2(p) of opposite conductivity types, the number of masks and the number of steps can be decreased to enable efficient manufacture of DRAMs.

What is claimed is:

1. A method of manufacturing a semiconductor device, comprising the steps of:

forming gate electrodes in a first region over a semiconductor substrate and one gate electrode in a second region over said semiconductor substrate, and then forming first impurity diffusion layers on both sides of said gate electrodes in said first and second regions;

forming a first passivation film in said first and second regions;

forming an insulating film in said first and second regions, processing said insulating film in said second region to form a side wall on both sides of the gate electrode in said second region to expose a surface of said semiconductor substrate on both sides of said side wall;

forming, in said semiconductor substrate exposed on both sides of said side wall, a second impurity diffusion layer partially to overlap said first impurity diffusion layer;

forming a second passivation film in said first and second regions; and forming a first connection hole for exposing said first impurity diffusion layer in said first region, and a second connection hole for exposing said second impurity diffusion layer in said second region, by using said first and second passivation films.

2. A method according to claim 1, further comprising the step of forming a metal silicide film on said second impurity diffusion layer after said second impurity diffusion layer is formed, said metal silicide film being exposed in said second region when said second connection hole is formed.

3. A method according to claim 1, wherein said first and second passivation films are made of materials having the same etching characteristics, and said step of forming said first and second connection holes includes the step of anisotropically etching an insulating interlayer formed to have a thickness to bury said gate electrodes in said first and second regions, and said second passivation film over the first region side under a condition with a low selectivity to said materials of said first and second passivation films so as to perforate said interlayer and said second passivation film, and then anisotropically etching said insulating film under a condition with a high selectivity to said materials of said first and second passivation films.

4. A method according to claim 3, further comprising the step of planarizing a surface of said insulating interlayer by chemical mechanical polishing after said insulating interlayer is formed, said insulating interlayer being polished until said second passivation film over said gate electrodes on the first region side is removed in chemical mechanical polishing.

5. A method according to claim 1, wherein a mask is formed to have an opening at said first region and cover said second region after said second passivation film is formed, and said second passivation film over the first region side is removed using said mask.

6. A method of manufacturing a semiconductor device, comprising the steps of:

forming gate electrodes in a first region over a semiconductor substrate and one gate electrode in a second region over said semiconductor substrate, and then forming first impurity diffusion layers on both sides of said gate electrodes in said first and second regions;

forming a first passivation film in said first and second regions;

forming an insulating film in said first and second regions, processing said insulating film in said second region to form a side wall on both sides of the gate electrode in said second region to expose a surface of said semiconductor substrate on both sides of said side wall;

forming, in said semiconductor substrate exposed on both sides of said side wall, a second impurity diffusion layer partially to overlap said first impurity diffusion layer, and then removing said insulating film in said first region and said side wall in said second region;

forming a second passivation film in said first and second regions; and forming a first connection hole for exposing said first impurity diffusion layer in said first region, and a second connection hole for exposing said second impurity diffusion layer in said second region, by using said first and second passivation films.

7. A method according to claim 6, further comprising the step of forming a metal silicide film on said second impurity diffusion layer after said second impurity diffusion layer is formed, said metal silicide film being exposed in said second region when said second connection hole is formed.

8. A method of manufacturing a semiconductor device, comprising the steps of:

forming gate electrodes in a first region over a semiconductor substrate and one gate electrode in a second region over said semiconductor substrate, and then forming first impurity diffusion layers on both sides of said gate electrodes in said first and second regions;

forming a first passivation film in said first and second regions;

forming an insulating film in said first and second regions, processing said insulating film in said second region to form a side wall on both sides of the gate electrode in said second region to expose a surface of said semiconductor substrate on both sides of said side wall;

forming, in said semiconductor substrate exposed on both sides of said side wall, a second impurity diffusion layer partially to overlap said first impurity diffusion layer;

forming a metal silicide film on said second impurity diffusion layer after said second impurity layer is formed; and second regions; and forming a first connection hole for exposing said first impurity diffusion layer in said first region, and a second connection hole for exposing said second impurity diffusion layer in said second region, by using said first and second passivation films.

9. A method according to claim 8, wherein said metal silicide film is exposed in said second region when said second connection hole is formed.

10. A method according to claim 8, wherein said second passivation film is formed to a thickness not to fill spaces between the gate electrodes in said second region while leaving said insulating film in said first region and said side wall in said second region after said second impurity diffusion layer is formed.

11. A method according to claim 8, wherein said insulating film in said first region and said side wall in said second region are formed after said second impurity diffusion layer is formed, and said second passivation film is formed to a thickness not to fill spaces between the gate electrodes in said first region.

* * * * *